(12) United States Patent
Raring et al.

(10) Patent No.: US 11,016,378 B2
(45) Date of Patent: *May 25, 2021

(54) LASER LIGHT SOURCE

(71) Applicant: Soraa Laser Diode, Inc., Goleta, CA (US)

(72) Inventors: James W. Raring, Santa Barbara, CA (US); Paul Rudy, Manhattan Beach, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/140,357

(22) Filed: Sep. 24, 2018

(65) Prior Publication Data

US 2019/0025687 A1 Jan. 24, 2019

Related U.S. Application Data

(60) Continuation of application No. 15/796,568, filed on Oct. 27, 2017, now Pat. No. 10,108,079, which is a
(Continued)

(51) Int. Cl.
*G03B 21/20* (2006.01)
*H04N 9/31* (2006.01)
(Continued)

(52) U.S. Cl.
CPC ............ *G03B 21/2066* (2013.01); *F21K 9/64* (2016.08); *F21S 41/14* (2018.01); *F21S 41/16* (2018.01); *G03B 21/2033* (2013.01); *H01S 5/0071* (2013.01); *H01S 5/34333* (2013.01); *H01S 5/4093* (2013.01); *H04N 9/3129* (2013.01);
(Continued)

(58) Field of Classification Search
CPC .. H04N 9/3129; H04N 9/3161; H04N 9/3132; H04N 9/31; H04N 5/74; H04N 5/7475; H04N 5/7441; H04N 13/0497; H04N 13/0431; H04N 13/0434; H04N 13/337; H04N 13/363; H04N 13/334; G03B 21/2033; G03B 21/2066; G03B 21/204;
(Continued)

(56) References Cited

U.S. PATENT DOCUMENTS 4,318,058 A 3/1982 Mito et al.
4,341,592 A 7/1982 Shortes et al.
(Continued)

FOREIGN PATENT DOCUMENTS

CN 1452254 10/2003
CN 1655371 8/2005
(Continued)

OTHER PUBLICATIONS

U.S. Appl. No. 12/789,303, Non-Final Office Action dated Sep. 24, 2012, 20 pages.
(Continued)

*Primary Examiner* — Brian P Yenke
*Assistant Examiner* — Sean N. Haiem
(74) *Attorney, Agent, or Firm* — Kilpatrick Townsend & Stockton LLP

(57) ABSTRACT

The present invention is directed to a laser light source.

16 Claims, 17 Drawing Sheets

Related U.S. Application Data continuation of application No. 14/802,960, filed on Jul. 17, 2015, now Pat. No. 9,829,780, which is a continuation-in-part of application No. 14/743,971, filed on Jun. 18, 2015, now Pat. No. 9,829,778, which is a continuation of application No. 14/262,208, filed on Apr. 25, 2014, now Pat. No. 9,100,590, which is a continuation of application No. 13/678,101, filed on Nov. 15, 2012, now Pat. No. 8,749,719, which is a division of application No. 12/789,303, filed on May 27, 2010, now Pat. No. 8,427,590, said application No. 14/802,960 is a continuation-in-part of application No. 13/938,048, filed on Jul. 9, 2013, now Pat. No. 9,250,044, which is a continuation-in-part of application No. 12/787,343, filed on May 25, 2010, now Pat. No. 8,509,275.

(60) Provisional application No. 61/182,106, filed on May 29, 2009, provisional application No. 61/182,105, filed on May 29, 2009, provisional application No. 61/182,104, filed on May 29, 2009.

(51) Int. Cl.
| | |
|---|---|
| *H04N 13/334* | (2018.01) |
| *H04N 13/337* | (2018.01) |
| *H01S 5/343* | (2006.01) |
| *F21S 41/16* | (2018.01) |
| *F21S 41/14* | (2018.01) |
| *H04N 13/363* | (2018.01) |
| *H01S 5/40* | (2006.01) |
| *H01S 5/00* | (2006.01) |
| *F21K 9/64* | (2016.01) |
| *H01S 5/22* | (2006.01) |

(52) U.S. Cl.
CPC ......... *H04N 9/3161* (2013.01); *H04N 13/334* (2018.05); *H04N 13/337* (2018.05); *H04N 13/363* (2018.05); *G03B 21/204* (2013.01); *H01S 5/22* (2013.01); *H01S 5/4012* (2013.01)

(58) Field of Classification Search
CPC .... F21S 5/34333; F21S 5/0071; F21S 5/4093; F21S 41/14; F21S 41/16; F21K 9/64
USPC .......................................................... 348/744
See application file for complete search history.

(56) References Cited

U.S. PATENT DOCUMENTS

| | | |
|---|---|---|
| 4,860,687 A | 8/1989 | Frijlink |
| 4,911,102 A | 3/1990 | Manabe et al. |
| 5,208,307 A | 5/1993 | Doi et al. |
| 5,331,654 A | 7/1994 | Jewell et al. |
| 5,334,277 A | 8/1994 | Nakamura |
| 5,366,953 A | 11/1994 | Char et al. |
| 5,527,417 A | 6/1996 | Iida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Horie et al. |
| 5,982,969 A | 11/1999 | Sugiyama et al. |
| 6,069,394 A | 5/2000 | Hashimoto et al. |
| 6,072,197 A | 6/2000 | Horino et al. |
| 6,147,953 A | 11/2000 | Duncan |
| 6,150,943 A | 11/2000 | Lehman et al. |
| 6,153,010 A | 11/2000 | Kiyoku et al. |
| 6,188,495 B1 | 2/2001 | Inoue et al. |
| 6,195,381 B1 | 2/2001 | Botez et al. |
| 6,239,454 B1 | 5/2001 | Glew et al. |
| 6,283,597 B1 | 9/2001 | Jorke |
| 6,379,985 B1 | 4/2002 | Cervantes et al. |
| 6,451,157 B1 | 9/2002 | Hubacek |
| 6,489,636 B1 | 12/2002 | Goetz et al. |
| 6,586,762 B2 | 7/2003 | Kozaki |
| 6,635,904 B2 | 10/2003 | Goetz et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,920,166 B2 | 7/2005 | Akasaka et al. |
| 7,009,199 B2 | 3/2006 | Hall |
| 7,019,325 B2 | 3/2006 | Li et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,148,801 B2 | 4/2012 | D'Evelyn |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,284,810 B1 | 10/2012 | Sharma et al. |
| 8,294,179 B1 | 10/2012 | Raring |
| 8,314,429 B1 | 11/2012 | Raring et al. |
| 8,351,478 B2 | 1/2013 | Raring et al. |
| 8,355,418 B2 | 1/2013 | Raring et al. |
| 8,416,825 B1 | 4/2013 | Raring |
| 8,422,525 B1 | 4/2013 | Raring et al. |
| 8,427,590 B2 | 4/2013 | Raring et al. |
| 8,451,876 B1 | 5/2013 | Raring et al. |
| 8,509,275 B1 | 8/2013 | Raring et al. |
| 8,582,038 B1 | 11/2013 | Raring et al. |
| 8,717,505 B1 | 5/2014 | Raring et al. |
| 8,730,410 B1 | 5/2014 | Raring et al. |
| 8,749,719 B2 | 6/2014 | Raring et al. |
| 8,773,598 B2 | 7/2014 | Raring et al. |
| 9,013,638 B2 | 4/2015 | Raring et al. |
| 9,019,437 B2 | 4/2015 | Raring et al. |
| 9,071,772 B2 | 6/2015 | Raring et al. |

(56) References Cited

U.S. PATENT DOCUMENTS

| | | |
|---|---|---|
| 9,100,590 B2 | 8/2015 | Raring et al. |
| 9,714,749 B1 | 7/2017 | Salter et al. |
| 10,108,079 B2 | 10/2018 | Raring et al. |
| 2001/0048114 A1 | 12/2001 | Morita et al. |
| 2002/0027933 A1 | 3/2002 | Tanabe et al. |
| 2002/0105986 A1 | 8/2002 | Yamasaki |
| 2002/0159741 A1 | 10/2002 | Graves et al. |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0063476 A1 | 4/2003 | English et al. |
| 2003/0129810 A1 | 7/2003 | Barth et al. |
| 2003/0140846 A1 | 7/2003 | Biwa et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0012027 A1 | 1/2004 | Keller et al. |
| 2004/0025787 A1 | 2/2004 | Selbrede et al. |
| 2004/0031978 A1 | 2/2004 | D'Evelyn et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0233950 A1* | 11/2004 | Furukawa ............... H01S 5/028 372/43.01 |
| 2004/0247275 A1 | 12/2004 | Vakhshoori et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0231973 A1 | 10/2005 | Cassarly et al. |
| 2005/0286591 A1 | 12/2005 | Lee |
| 2006/0030738 A1 | 2/2006 | Vanmaele et al. |
| 2006/0033009 A1* | 2/2006 | Kobayashi ............ G02B 27/48 250/208.1 |
| 2006/0037529 A1 | 2/2006 | D'Evelyn et al. |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0087864 A1 | 4/2006 | Peng et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0213429 A1 | 9/2006 | Motoki et al. |
| 2006/0215127 A1* | 9/2006 | Peterson ................. H04N 5/20 353/74 |
| 2006/0216416 A1 | 9/2006 | Sumakeris et al. |
| 2006/0256482 A1 | 11/2006 | Araki et al. |
| 2006/0262243 A1* | 11/2006 | Lester ..................... G02F 2/02 349/71 |
| 2006/0279662 A1 | 12/2006 | Kapellner et al. |
| 2006/0288928 A1 | 12/2006 | Eom et al. |
| 2007/0019408 A1 | 1/2007 | McGuire et al. |
| 2007/0081857 A1 | 4/2007 | Yoon |
| 2007/0086916 A1 | 4/2007 | LeBoeuf et al. |
| 2007/0091634 A1 | 4/2007 | Sakurada |
| 2007/0093073 A1 | 4/2007 | Farrell et al. |
| 2007/0101932 A1 | 5/2007 | Schowalter et al. |
| 2007/0109504 A1 | 5/2007 | Miyazawa |
| 2007/0110112 A1 | 5/2007 | Sugiura |
| 2007/0120141 A1 | 5/2007 | Moustakas et al. |
| 2007/0153866 A1* | 7/2007 | Shchegrov ........... G02B 27/102 372/50.124 |
| 2007/0163490 A1 | 7/2007 | Habel et al. |
| 2007/0166853 A1 | 7/2007 | Guenther et al. |
| 2007/0184637 A1 | 8/2007 | Haskell et al. |
| 2007/0190758 A1 | 8/2007 | Kaeding et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0252918 A1 | 11/2007 | Furuya et al. |
| 2007/0259464 A1 | 11/2007 | Bour et al. |
| 2007/0280320 A1* | 12/2007 | Feezell ................ H01S 5/18341 372/46.01 |
| 2008/0006831 A1 | 1/2008 | Ng |
| 2008/0029152 A1 | 2/2008 | Milshtein et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0143970 A1 | 6/2008 | Harbers et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0252778 A1* | 10/2008 | Dunki-Jacobs .......... G09G 5/00 348/441 |
| 2008/0259431 A1 | 10/2008 | Weichmann et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1* | 1/2009 | De Lega ............ G01B 9/02027 356/73 |
| 2009/0058532 A1 | 3/2009 | Kikkawa et al. |
| 2009/0066241 A1* | 3/2009 | Yokoyama .......... H01L 51/5036 313/504 |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0086170 A1* | 4/2009 | El-Ghoroury .......... B82Y 20/00 353/38 |
| 2009/0141242 A1 | 6/2009 | Silverstein et al. |
| 2009/0141765 A1 | 6/2009 | Kohda et al. |
| 2009/0153752 A1* | 6/2009 | Silverstein ......... G02B 27/1026 348/750 |
| 2009/0157229 A1* | 6/2009 | Rulkens ................ C25D 21/12 700/267 |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0316116 A1* | 12/2009 | Melville ............... A61B 1/0008 353/31 |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |

(56) References Cited

U.S. PATENT DOCUMENTS

| | | | |
|---|---|---|---|
| 2010/0006546 A1* | 1/2010 | Young | B44C 1/228 219/121.69 |
| 2010/0006873 A1 | 1/2010 | Raring et al. | |
| 2010/0025656 A1 | 2/2010 | Raring et al. | |
| 2010/0031875 A1 | 2/2010 | D'Evelyn | |
| 2010/0044718 A1 | 2/2010 | Hanser et al. | |
| 2010/0046234 A1* | 2/2010 | Abu-Ageel | G02B 3/0006 362/308 |
| 2010/0096615 A1 | 4/2010 | Okamoto et al. | |
| 2010/0104495 A1 | 4/2010 | Kawabata et al. | |
| 2010/0140745 A1 | 6/2010 | Khan et al. | |
| 2010/0150193 A1* | 6/2010 | Bhat | B82Y 20/00 372/44.01 |
| 2010/0151194 A1 | 6/2010 | D'Evelyn | |
| 2010/0187550 A1* | 7/2010 | Reed | H01L 33/18 257/98 |
| 2010/0189155 A1 | 7/2010 | Tanaka et al. | |
| 2010/0195687 A1 | 8/2010 | Okamoto et al. | |
| 2010/0220262 A1 | 9/2010 | DeMille et al. | |
| 2010/0276663 A1 | 11/2010 | Enya et al. | |
| 2010/0295054 A1 | 11/2010 | Okamoto et al. | |
| 2010/0302464 A1 | 12/2010 | Raring et al. | |
| 2010/0309943 A1 | 12/2010 | Chakraborty et al. | |
| 2010/0316075 A1 | 12/2010 | Raring et al. | |
| 2010/0327291 A1 | 12/2010 | Preble et al. | |
| 2011/0001431 A1 | 1/2011 | Brukilacchio | |
| 2011/0031508 A1 | 2/2011 | Hamaguchi et al. | |
| 2011/0057167 A1 | 3/2011 | Ueno et al. | |
| 2011/0064100 A1 | 3/2011 | Raring et al. | |
| 2011/0064101 A1 | 3/2011 | Raring et al. | |
| 2011/0064102 A1 | 3/2011 | Raring et al. | |
| 2011/0073888 A1 | 3/2011 | Ueno et al. | |
| 2011/0075694 A1 | 3/2011 | Yoshizumi et al. | |
| 2011/0103418 A1 | 5/2011 | Hardy et al. | |
| 2011/0122646 A1 | 5/2011 | Bickham et al. | |
| 2011/0129669 A1* | 6/2011 | Fujito | C23C 16/303 428/402 |
| 2011/0148280 A1 | 6/2011 | Kishimoto et al. | |
| 2011/0150020 A1 | 6/2011 | Haase et al. | |
| 2011/0186874 A1 | 8/2011 | Shum | |
| 2011/0186887 A1 | 8/2011 | Trottier et al. | |
| 2011/0188530 A1 | 8/2011 | Lell et al. | |
| 2011/0216795 A1 | 9/2011 | Hsu et al. | |
| 2011/0247556 A1 | 10/2011 | Raring et al. | |
| 2011/0280032 A1 | 11/2011 | Kishimoto | |
| 2012/0104359 A1 | 5/2012 | Felker et al. | |
| 2012/0178198 A1 | 7/2012 | Raring et al. | |
| 2012/0187371 A1 | 7/2012 | Raring et al. | |
| 2012/0314398 A1 | 12/2012 | Raring et al. | |
| 2013/0022064 A1 | 1/2013 | Raring et al. | |
| 2013/0088888 A1 | 4/2013 | Fewkes et al. | |
| 2013/0229820 A1 | 9/2013 | Jutila et al. | |
| 2014/0253697 A1 | 9/2014 | Raring et al. | |
| 2014/0268815 A1 | 9/2014 | Li et al. | |
| 2016/0131334 A1 | 5/2016 | Rousseau et al. | |
| 2016/0236613 A1 | 8/2016 | Trier | |
| 2017/0072841 A1 | 3/2017 | Schabacker et al. | |

FOREIGN PATENT DOCUMENTS

| | | |
|---|---|---|
| CN | 1668947 | 9/2005 |
| CN | 1953197 | 4/2007 |
| JP | 03287770 | 12/1991 |
| JP | 07162081 | 6/1995 |
| JP | 2001-230497 A | 8/2001 |
| JP | 2002009402 | 1/2002 |
| JP | 2002185082 | 6/2002 |
| JP | 2004503923 | 2/2004 |
| JP | 2004-071885 A | 3/2004 |
| JP | 2004152841 | 5/2004 |
| JP | 2004186527 | 7/2004 |
| JP | 2004304111 | 10/2004 |
| JP | 2006091285 | 4/2006 |
| JP | 2006120923 | 5/2006 |
| JP | 2007068398 | 3/2007 |
| JP | 2007173467 | 7/2007 |
| JP | 2007529910 | 10/2007 |
| JP | 2008-3125 A | 1/2008 |
| JP | 2008-508559 A | 3/2008 |
| JP | 2008-153286 A | 7/2008 |
| JP | 2008-193057 A | 8/2008 |
| JP | 2008533723 | 8/2008 |
| JP | 2008288527 | 11/2008 |
| JP | 2008543089 | 11/2008 |
| JP | 2008311640 | 12/2008 |
| JP | 2009-501843 A | 1/2009 |
| JP | 2009021506 | 1/2009 |
| JP | 2009-070893 A | 4/2009 |
| JP | 2009158893 | 7/2009 |
| WO | 2006/015133 A2 | 2/2006 |
| WO | 2006099138 | 9/2006 |
| WO | 2007/009035 A2 | 1/2007 |
| WO | 2007/119723 A1 | 10/2007 |
| WO | 2008041521 | 4/2008 |
| WO | 2008109296 | 9/2008 |
| WO | 2008143276 | 11/2008 |
| WO | 2010120819 | 10/2010 |
| WO | 2012016033 | 2/2012 |

OTHER PUBLICATIONS

U.S. Appl. No. 12/789,303, Notice of Allowance dated Dec. 21, 2012, 5 pages.

U.S. Appl. No. 13/678,101, Notice of Allowance dated Jan. 24, 2014, 10 pages.

U.S. Appl. No. 13/678,122, Notice of Allowance dated Mar. 4, 2014, 18 pages.

U.S. Appl. No. 13/739,961, Notice of Allowance dated Dec. 10, 2013, 13 pages.

U.S. Appl. No. 13/853,694, Notice of Allowance dated Sep. 3, 2013, 8 pages.

U.S. Appl. No. 14/035,045, Notice of Allowance dated Jan. 13, 2014, 9 pages.

U.S. Appl. No. 14/199,672, Non-Final Office Action dated Oct. 8, 2014, 7 pages.

U.S. Appl. No. 14/199,672, Notice of Allowance dated Feb. 2, 2015, 5 pages.

U.S. Appl. No. 14/262,208, Non-Final Office Action dated Dec. 22, 2014, 10 pages.

U.S. Appl. No. 14/262,208, Notice of Allowance dated Apr. 23, 2015, 5 pages.

U.S. Appl. No. 14/307,214, Notice of Allowance dated Feb. 27, 2015, 10 pages.

U.S. Appl. No. 14/743,971, Final Office Action dated Nov. 30, 2016, 23 pages.

U.S. Appl. No. 14/743,971, Non-Final Office Action dated May 12, 2017, 20 pages.

U.S. Appl. No. 14/743,971, Non-Final Office Action dated Apr. 21, 2016, 23 pages.

U.S. Appl. No. 14/743,971, Notice of Allowance dated Jul. 28, 2017, 5 pages.

U.S. Appl. No. 14/802,960, Final Office Action dated Nov. 30, 2016, 23 pages.

U.S. Appl. No. 14/802,960, Non-Final Office Action dated May 8, 2017, 19 pages.

U.S. Appl. No. 14/802,960, Non-Final Office Action dated Apr. 15, 2016, 23 pages.

U.S. Appl. No. 14/802,960, Notice of Allowance dated Jul. 31, 2017, 5 pages.

U.S. Appl. No. 15/796,568, First Action Interview Pilot Program Pre-Interview Communication dated Apr. 17, 2018, 5 pages.

U.S. Appl. No. 15/796,568, Notice of Allowance dated Jun. 22, 2018, 6 pages.

Abare et al., Cleaved and Etched Facet Nitride Laser Diodes, IEEE Journal of Selected Topics in Quantum Electronics, vol. 4, No. 3, May-Jun. 1998, pp. 505-509.

(56) References Cited

OTHER PUBLICATIONS

Adesida et al., Characteristics of Chemically Assisted Ion Beam Etching of Gallium Nitride, Applied Physics Letters, vol. 65, No. 7, Aug. 15, 1994, pp. 889-891.
Aoki et al., InGaAs/InGaAsP MQW Electroabsorption Modulator Integrated with a DFB Laser Fabricated by Band-Gap Energy Control Selective Area MOCVD, IEEE Journal of Quantum Electronics, vol. 29, No. 6, Jun. 1993, pp. 2088-2096.
Asano et al., 100-mW Kink-Free Blue-Violet Laser Diodes with Low Aspect Ratio, IEEE Journal of Quantum Electronics, vol. 39, No. 1, Jan. 2003, pp. 135-140.
Bernardini et al., Spontaneous Polarization and Piezoelectric Constants of III-V Nitrides, Physical Review B, vol. 56, No. 16, Oct. 15, 1997, pp. 10024-10027.
Caneau et al., Studies on the Selective OMVPE of (Ga,In)/(As,P), Journal of Crystal Growth, vol. 124, Nov. 1, 1992, pp. 243-248.
Chen et al., Growth and Optical Properties of Highly Uniform and Periodic InGaN Nanostructures, Advanced Materials, vol. 19, 2007, pp. 1707-1710.
D'Evelyn et al., Bulk GaN Crystal Growth by the High-Pressure Ammonothermal Method, Journal of Crystal Growth, vol. 300, No. 1, Mar. 1, 2007, pp. 11-16.
Founta et al., Anisotropic Morphology of Nonpolar a-Plane GaN Quantum Dots and Quantum Wells, Journal of Applied Physics, vol. 102, No. 7, 2007, pp. 074304-1-074304-6.
Franssila, Tools for CVD and Epitaxy, Introduction to Microfabrication, 2004, pp. 329-336.
Fujii et al., Increase in the Extraction Efficiency of GaN-Based Light-Emitting Diodes via Surface Roughening, Applied Physics Letters, vol. 84, No. 6, 2004, pp. 855-857.
Funato et al., Blue, Green, and Amber InGaN/GaN Light-Emitting Diodes on Semipolar {1122} GaN Bulk Substrates, Journal of Japanese Applied Physics, vol. 45, No. 26, 2006, pp. L659-L662.
Funato et al., Monolithic Polychromatic Light-Emitting Diodes Based on InGaN Microfacet Quantum Wells toward Tailor-Made Solid-State Lighting, Applied Physics Express, vol. 1, No. 1, 2008, pp. 011106-1-011106-3.
Gardner et al., Blue-Emitting InGaN—GaN Double-Heterostructure Light-Emitting Diodes Reaching Maximum Quantum Efficiency Above 200A/cm2, Applied Physics Letters, vol. 91, 2007, pp. 243506-1-243506-3.
Hiramatsu et al., Selective Area Growth and Epitaxial Lateral Overgrowth of GaN by Metalorganic Vapor Phase Epitaxy and Hydride Vapor Phase Epitaxy, Materials Science and Engineering: B, vol. 59, Issue 1-3, May 6, 1999, pp. 104-111.
Iso, High Brightness Blue InGaN/GaN Light Emitting Diode on Nonpolar m-plane Bulk GaN Substrate, Japanese Journal of Applied Physics, vol. 46, 2007, L960-L962.
Kendall et al., Energy Savings Potential of Solid State Lighting in General Lighting Applications, Report for the Department of Energy, 2001, 35 pages.
Khan et al., Cleaved Cavity Optically Pumped InGaN—GaN Laser Grown on Spinel Substrates, Applied Physics Letters, vol. 69, No. 16, Oct. 14, 1996, pp. 2418-2420.
Kim et al., Improved Electroluminescence on Nonpolar m-Plane InGaN/GaN Qantum Well LEDs, Physica Status Solidi (RRL), vol. 1, No. 3, 2007, pp. 125-127.
Kuramoto et al., Novel Ridge-Type InGaN Multiple-Quantum-Well Laser Diodes Fabricated by Selective Area Re-Growth on n-GaN Substrates, Journal of Japanese Applied Physics, vol. 40, 2001, pp. L925-L927.
Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, 2004, pp. 7032-7035.
Masui et al., Electrical Characteristics of Nonpolar InGaN-Based Light-Emitting Diodes Evaluated at Low Temperature, Japanese Journal of Applied Physics, vol. 46, No. 11, 2007, pp. 7309-7310.
Michiue et al., Recent Development of Nitride LEDs and LDs, Proceedings of SPIE, vol. 7216, 2009, pp. 721612-1-721612-6.
Nakamura et al., InGaN/GaN/AlGaN-Based Laser Diodes with Modulation-Doped Strained-Layer Superlattices Grown on an Epitaxially Laterally Overgrown GaN Substrate, Applied Physics Letters, vol. 72, No. 2, 1998, pp. 211-213.
Nam et al., Lateral Epitaxial Overgrowth of GaN Films on SiO2 Areas via Metalorganic Vapor Phase Epitaxy, Journal of Electronic Materials, vol. 27, No. 4, Apr. 1998, pp. 233-237.
Okamoto et al., Continuous-Wave Operation of m-Plane InGaN Multiple Quantum Well Laser Diodes, the Japan Society of Applied Physics, JJAP Express Letter, vol. 46, No. 9, 2007, pp. L187-L189.
Okamoto et al., High-Efficiency Continuous-Wave Operation of Blue-Green Laser Diodes Based on Nonpolar mPlane Gallium Nitride, the Japan Society of Applied Physics, Applied Physics Express, vol. 1, Jun. 20, 2008, pp. 072201-1-072201-3.
Okamoto et al., Pure Blue Laser Diodes Based on Nonpolar m-Piane Gallium Nitride with InGaN Waveguiding Layers, Journal of Japanese Applied Physics, vol. 46, No. 35, 2007, pp. L820-L822.
Okubo et al., Nichia Develops Blue-green Semiconductor Laser w/ 488nm Wavelength, Nikkei Technology Online, http://techon.nikkeibp.co.jp/english/NEWS_EN/20080122/146009/, Jan. 22, 2008, 3 pages.
Park, Crystal Orientation Effects on Electronic Properties of Wurtzite InGaN/GaN Quantum Wells, Journal of Applied Physics, vol. 91, No. 12, Jun. 15, 2002, pp. 9904-9908.
International Application No. PCT/US2009/046786, International Search Report and Written Opinion dated May 13, 2010, 8 pages.
International Application No. PCT/US2009/047107, International Search Report and Written Opinion dated Sep. 29, 2009, 10 pages.
International Application No. PCT/US2009/052611, International Search Report and Written Opinion dated Sep. 29, 2009, 11 pages.
International Application No. PCT/US2010/030939, International Search Report and Written Opinion dated Jun. 16, 2010, 9 pages.
International Application No. PCT/US2010/036739, International Search Report and Written Opinion dated Nov. 8, 2010, 10 pages.
International Application No. PCT/US2010/049172, International Search Report and Written Opinion dated Nov. 17, 2010, 7 pages.
International Application No. PCT/US2011/037792, International Search Report and Written Opinion dated Sep. 8, 2011, 9 pages.
International Application No. PCT/US2011/060030, International Search Report and Written Opinion dated Mar. 21, 2012, 8 pages.
Purvis, Changing the Crystal Face of Gallium Nitride, the Advance Semiconductor Magazine, III-Vs Review, vol. 18, No. 8, Nov. 8, 2005, 3 pages.
Romanov et al., Strain-Induced Polarization in Wurtzite III-Nitride Semipolar Layers, J. Appl. Phys., vol. 100, 2006, pp. 023522-1-023522-10.
Sato et al., High Power and High Efficiency Green Light Emitting Diode on Free-Standing Semipolar (1122) Bulk GaN Substrate, Physica Status Sol. (RRL), vol. 1, No. 4, Jun. 15, 2007, pp. 162-164.
Sato et al., Optical Properties of Yellow Light-Emitting-Diodes Grown on Semipolar (1122) Bulk GaN Substrate, Applied Physics Letter, vol. 92, No. 22, 2008, pp. 221110-1-221110-3.
Schmidt et al., Demonstration of Nonpolar m-Plane InGaN/GaN Laser Diodes, Japanese Journal of Applied Physics, vol. 46, No. 9, 2007, pp. L190-L191.
Schmidt et al., High Power and High External Efficiency m-Plane InGaN Light Emitting Diodes, Japanese Journal of Applied Physics, vol. 46, No. 7, Feb. 9, 2007, pp. L126-L128.
Schoedl et al., Facet Degradation of GaN Heterostructure Laser Diodes, Journal of Applied Physics, vol. 97, No. 12, 2005, pp. 123102-1-123102-8.
Schremer et al., Progress in Etched Facet Technology for GaN and Blue Lasers, Proc. of SPIE 6473, vol. 6473, 2007, pp. 6473F-1-6473F-8.
Shchekin et al., High Performance Thin-Film Flip-Chip InGaN—GaN Light-Emitting Diodes, Applied Physics Letters, vol. 89, Aug. 16, 2006, pp. 071109-1-071109-3.
Shen et al., Auger Recombination in InGaN Measured by Photoluminescence, Applied Physics Letters, vol. 91, Oct. 1, 2007, pp. 141101-1-141101-3.
Sizov et al., 500-nm Optical Gain Anisotropy of Semipolar (1122) InGaN Quantum Wells, Applied Physics Express, vol. 2, Jun. 19, 2009, pp. 071001-1-071001-3.

(56) References Cited

OTHER PUBLICATIONS

Tomiya et al., Dislocation Related Issues in the Degradation of GaN-Based Laser Diodes, IEEE Journal of Selected Topics in Quantum Electronics, vol. 10, No. 6, Nov.-Dec. 2004, pp. 1277-1286.

Tyagi et al., High Brightness Violet InGan/Gan Light EMitting Diodes on Semipolar (1011) Bulk Gan Substrates, Japanese Journal of Applied Physics, vol. 46, No. 7, Feb. 9, 2007, pp. L129-L131.

Tyagi et al., Semipolar (1011) InGaN/GaN Laser Diodes on Bulk GaN Substrates, Japanese Journal of Applied Physics, vol. 46, No. 19, May 11, 2007, pp. L444-L445.

Uchida et al., Recent Progress in High-Power Blue-Violet Lasers, IEEE Journal of Selected Topics in Quantum Electronics, vol. 9, No. 5, 2003, pp. 1252-1259.

Waltereit et al., Nitride Semiconductors Free of Electrostatic Fields for Efficient White Light-Emitting Diodes, Nature, vol. 406, Aug. 24, 2000, pp. 865-868.

Yamaguchi, Anisotropic Optical Matrix Elements in Strained GaN-Quantum Wells with Various Substrate Orientations, Physica Status Solidi (PSS), vol. 5, No. 6, May 2008, pp. 2329-2332.

Yoshizumi et al., Continuous-Wave Operation of 520 nm Green InGaN-Based Laser Diodes on Semi-Polar {2021} GaN Substrates, Applied Physics Express, vol. 2, No. 9, Aug. 2009, pp. 1-3.

Yu et al., Multiple Wavelength Emission from Semipolar InGaN/GaN Quantum Wells Selectively Grown by MOCVD, Conference on Lasers and Electro-Optics/Quantum Electronics and Laser Science Conference and Photonic Applications Systems Technologies, OSA Technical Digest (CD), 2007, 2 pages.

Zhong et al., Demonstration of High Power Blue-Green Light Emitting Diode on Semipolar (1122) Bulk GaN Substrate, Electronics Letters, vol. 43, No. 15, Jul. 19, 2007, 2 pages.

Zhong et al., High Power and High Efficiency Blue Light Emitting Diode on Freestanding Semipolar (1011) Bulk GaN Substrate, Applied Physics Letter, vol. 90, No. 23, 2007, pp. 233504-1-233504-3.

U.S. Appl. No. 16/380,217 Non-Final Office Action dated May 13, 2020, 56 pages.

U.S. Appl. No. 16/380,217 Final Office Action dated Aug. 27, 2020, 58 pages.

U.S. Appl. No. 16/835,897 Non-Final Office Action dated Jan. 1, 2021, 32 pages.

U.S. Appl. No. 16/380,217 Non-Final Office Action dated Feb. 17, 2021, 66 pages.

Merriam Webster, "Collimate", retrieved from https://www.merriam-webster.com/dictionary/collimate on Feb. 10, 2021, 1 page.

\* cited by examiner

LASER LIGHT SOURCE

CROSS-REFERENCE TO RELATED APPLICATIONS

The present application is a continuation of U.S. application Ser. No. 15/796,568, filed Oct. 27, 2017 which is a continuation of U.S. application Ser. No. 14/802,960, filed Jul. 17, 2015 which is a continuation-in-part of U.S. application Ser. No. 14/743,971, filed on Jun. 18, 2015, which is a continuation of U.S. application Ser. No. 14/262,208, filed on Apr. 25, 2014, which is a continuation of U.S. application Ser. No. 13/678,101, filed on Nov. 15, 2012, which is a divisional of U.S. application Ser. No. 12/789,303, filed on May 27, 2010, which claims priority to U.S. Provisional Patent Application No. 61/182,105, filed May 29, 2009, and U.S. Provisional Patent Application No. 61/182,106, filed May 29, 2009, each of which is incorporated by reference herein for all purposes. U.S. application Ser. No. 14/802,960, filed Jul. 17, 2015 is also a continuation-in-part of U.S. application Ser. No. 13/938,048, filed on Jul. 9, 2013, which is a continuation-in-part of U.S. application Ser. No. 12/787,343, filed on May 25, 2010, which claims priority to U.S. Provisional Patent Application No. 61/182,104, filed May 29, 2009, each of which is incorporated by reference herein for all purposes. The present application is also related to U.S. Provisional Patent Application No. 61/347,800, filed May 24, 2010, which is incorporated by reference herein for all purposes. The present application additionally is related to U.S. Provisional Patent Application No. 61/345,561, filed May 17, 2010, which is incorporated by reference herein for all purposes. This application is also related to U.S. patent application Ser. No. 12/749,466, filed Mar. 29, 2010, which is commonly assigned and incorporated by reference herein.

BACKGROUND OF THE INVENTION

The present invention is directed to a laser light source. In an example, such light source can be used for display technologies or a vehicle. More specifically, various embodiments of the present invention provide projection display systems where one or more laser diodes and/or LEDs are used as light source for illustrating images. In one set of embodiments, the present invention provides projector systems that utilize blue and/or green laser fabricated using gallium nitride containing material. In another set of embodiments, the present invention provides projection systems having digital lighting processing engines illuminated by blue and/or green laser devices. In a specific embodiment, the present invention provides a 3D display system. There are other embodiments as well.

Large displays are becoming increasingly popular and are expected to gain further traction in the coming years as LCD displays get cheaper for television and digital advertising becomes more popular at gas stations, malls, and coffee shops. Substantial growth (e.g., over 40%) has been seen in the past several years for large format displays (e.g., 40 inch TVs), and consumers have grown accustomed to larger displays for laptops and PCs as well. As more viewing content is available via hand held device such as TV, internet and video, displays in handheld consumer electronics remain small (<3") with the keyboard, camera, and other features competing for space and power.

Therefore, improved systems for displaying images and/or videos are desired.

BRIEF SUMMARY OF THE INVENTION

The present invention is directed to a laser light source. In an example, such light source can be used in display technologies or a vehicle. More specifically, various embodiments of the present invention provide projection display systems where one or more laser diodes are used as light source for illustrating images. In one set of embodiments, the present invention provides projector systems that utilize blue and/or green laser fabricated using gallium nitride containing material. In another set of embodiments, the present invention provides projection systems having digital lighting processing engines illuminated by blue and/or green laser devices. There are other embodiments as well.

According to an embodiment, the present invention provides a projection system. The projection system includes an interface for receiving video. The system also includes an image processor for processing the video. The system includes a light source including a plurality of laser diodes. The plurality of laser diodes includes a blue laser diode. The blue laser diode is fabricated on non-polar oriented gallium nitride material. The system includes a power source electrically coupled to the light source.

According to another embodiment, the present invention provides a projection system. The system includes an interface for receiving video. The system also includes an image processor for processing the video. The system includes a light source including a plurality of laser diodes. The plurality of laser diodes includes a blue laser diode. The blue laser diode is fabricated on semi-polar oriented gallium nitride material. The system also includes a power source electrically coupled to the light source.

According to an embodiment, the present invention provides a projection apparatus. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The laser source is configured produce a laser beam by combining outputs from the blue, green, and red laser diodes. The apparatus also includes a laser driver module coupled to the laser source. The laser driver module generates three drive currents based on a pixel from the one or more frames of images. Each of the three drive currents is adapted to drive a laser diode. The apparatus also includes a microelectromechanical system (MEMS) scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to an embodiment, the present invention provides a projection apparatus. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. In this embodiment, the blue and the green laser diode would share the same substrate. The red laser could be fabricated from AlInGaP. The laser source is configured produce a laser beam by combining outputs from the blue, green, and red laser diodes. The apparatus also includes a laser driver module coupled to the laser source. The laser driver module generates three drive currents based on a pixel from the one or more frames of images. Each of the three drive currents is adapted to drive a laser diode. The apparatus also includes a MEMS scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to an embodiment, the present invention provides a projection apparatus. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. In this embodiment, two or more of the different color lasers would be packaged together in the same enclosure. In this copackaging embodiment, the outputs from the blue, green, and red laser diodes would be combined into a single beam. The apparatus also includes a laser driver module coupled to the laser source. The laser driver module generates three drive currents based on a pixel from the one or more frames of images. Each of the three drive currents is adapted to drive a laser diode. The apparatus also includes a microelectromechanical system (MEMS) scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The laser source is configured produce a laser beam by combining outputs from the blue, green, and red laser diodes. The apparatus includes a digital light processing (DLP) chip comprising a digital mirror device. The digital mirror device including a plurality of mirrors, each of the mirrors corresponding to one or more pixels of the one or more frames of images. The apparatus includes a power source electrically coupled to the laser source and the digital light processing chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam.

According to another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The apparatus includes a digital light processing chip (DLP) comprising three digital mirror devices. Each of the digital mirror devices includes a plurality of mirrors. Each of the mirrors corresponds to one or more pixels of the one or more frames of images. The color beams are respectively projected onto the digital mirror devices. The apparatus includes a power source electrically coupled to the laser sources and the digital light processing chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam.

As an example, the color wheel may include phosphor material that modifies the color of light emitted from the light source. In a specific embodiment, the color wheel includes multiple regions, each of the regions corresponding to a specific color (e.g., red, green, blue, etc.). In an exemplary embodiment, a projector includes a light source that includes blue and red light sources. The color wheel includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the color wheel, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and color wheels thereof.

As another example, the color wheel may include multiple phosphor materials. For example, the color wheel may include both green and red phosphors in combination with a blue light source. In a specific embodiment, the color wheel includes multiple regions, each of the regions corresponding to a specific color (e.g., red, green, blue, etc.). In an exemplary embodiment, a projector includes a light source that includes a blue light source. The color wheel includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the color wheel, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and color wheels thereof.

As another example, the color wheel may include blue, green, and red phosphor materials. For example, the color wheel may include blue, green and red phosphors in combination with a ultra-violet (UV) light source. In a specific embodiment, color wheel includes multiple regions, each of the regions corresponding to a specific color (e.g., red, green, blue, etc.). In an exemplary embodiment, a projector includes a light source that includes a UV light source. The color wheel includes three phosphor containing regions for converting UV light to blue light, UV light to green light, and UV light and to red light, respectively. In operation, the color wheel emits blue, green, and red light from the phosphor containing regions in sequence. The blue, green and red light from the phosphor may be transmitted through the color wheel, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and color wheels thereof.

According to yet another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. he green laser diode has a wavelength of about 490 nm to 540 nm. The laser source is configured produce a laser beam by coming outputs from the blue, green, and red laser diodes. The apparatus includes a digital light processing chip comprising three digital mirror devices. Each of the digital mirror devices includes a plurality of mirrors. Each of the mirrors corresponds to one or more pixels of the one or more frames of images. The color beams are respectively projected onto the digital mirror devices. The apparatus includes a power source electrically coupled to the laser sources and the digital light processing chip. Many variations of this embodiment could exist, such as an embodiment where the green and blue laser diode share the same substrate or two or more of the different color lasers could be housed in the same package. In this copackaging embodiment, the outputs from the blue, green, and red laser diodes would be combined into a single beam.

As an example, the color wheel may include phosphor material that modifies the color of light emitted from the light source. In a specific embodiment, the color wheel includes multiple regions, each of the regions corresponding to a specific color (e.g., red, green, blue, etc.). In an exemplary embodiment, a projector includes a light source that includes blue and red light sources. The color wheel includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the color wheel, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and color wheels thereof.

As another example, the color wheel may include multiple phosphor materials. For example, the color wheel may include both green and red phosphors in combination with a blue light source. In a specific embodiment, the color wheel includes multiple regions, each of the regions corresponding to a specific color (e.g., red, green, blue, etc.). In an exemplary embodiment, a projector includes a light source that includes a blue light source. The color wheel includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the color wheel, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and color wheels thereof.

As another example, the color wheel may include blue, green, and red phosphor materials. For example, the color wheel may include blue, green and red phosphors in combination with a ultra-violet (UV) light source. In a specific embodiment, color wheel includes multiple regions, each of the regions corresponding to a specific color (e.g., red, green, blue, etc.). In an exemplary embodiment, a projector includes a light source that includes a UV light source. The color wheel includes three phosphor containing regions for converting UV light to blue light, UV light to green light, and UV light and to red light, respectively. In operation, the color wheel emits blue, green, and red light from the phosphor containing regions in sequence. The blue, green and red light from the phosphor may be transmitted through the color wheel, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and color wheels thereof.

Various benefits are achieved over pre-existing techniques using the present invention. In particular, the present invention enables a cost-effective projection systems that utilizes efficient light sources. In a specific embodiment, the light source can be manufactured in a relatively simple and cost effective manner. Depending upon the embodiment, the present apparatus and method can be manufactured using conventional materials and/or methods according to one of ordinary skill in the art. In one or more embodiments, the laser device is capable of multiple wavelengths. Of course, there can be other variations, modifications, and alternatives. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

Figure 1:
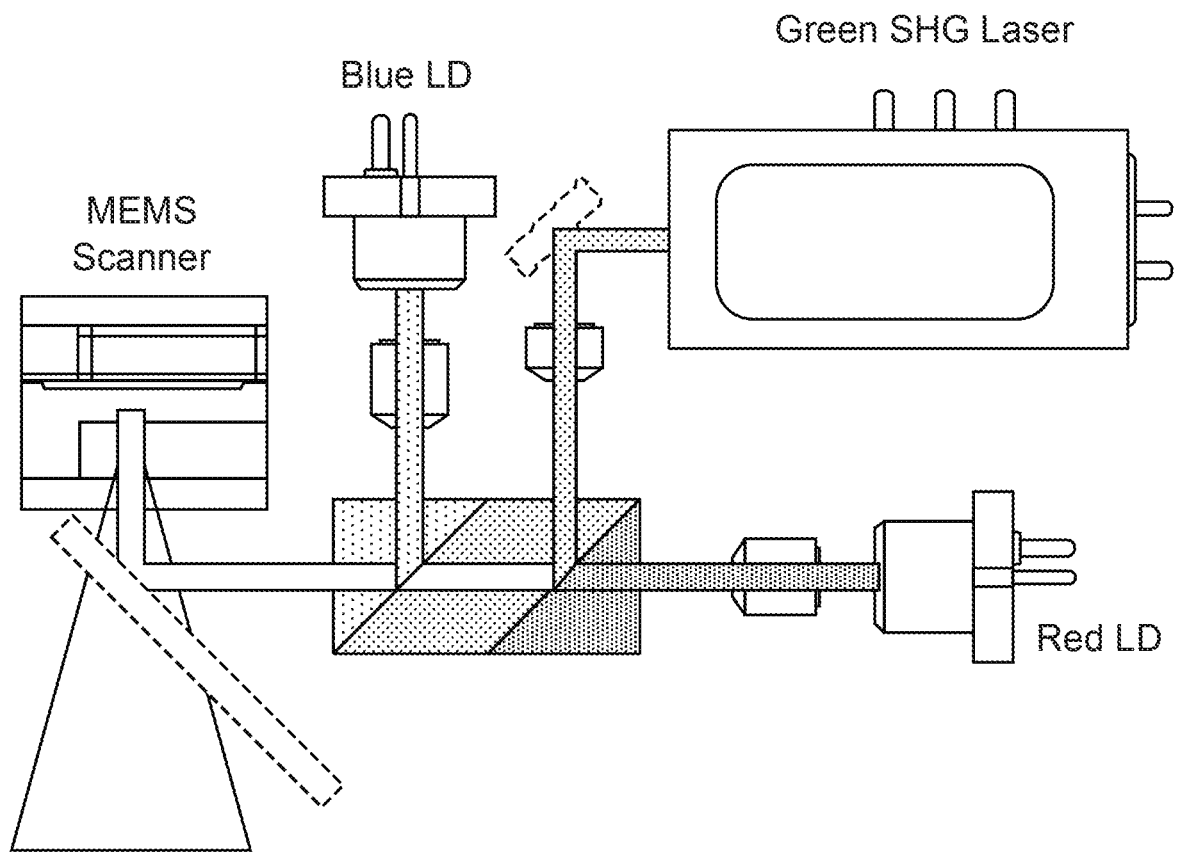
FIG. 1 is a diagram illustrating a conventional projection system.

The present invention is directed to a laser light source. In an example, such light source is directed to display technologies. More specifically, various embodiments of the present invention provide projection display systems where one or more laser diodes are used as light source for illustrating images. In one set of embodiments, the present invention provides projector systems that utilize blue and/or green laser fabricated using gallium nitride containing material. In another set of embodiments, the present invention provides projection systems having digital lighting processing engines illuminated by blue and/or green laser devices. There are other embodiments as well.

As explained above, conventional display type are often inadequate. Miniature projectors address this problem by projecting large images (up to 60 inch and above) from the hand held device, allowing movies, interne surfing and other images to be shared in a size format consistent with the displays customers are accustomed to. As a result, pocket projectors, standalone companion pico projectors, and embedded pico projectors in mobile devices such as phones are becoming increasingly available.

Present day commercial InGaN-based lasers and LEDs are grown on the polar c-plane of the GaN crystal. It is well known that InGaN light emitting layers deposited on this conventional GaN orientation suffer from internal polarization-related electric fields. In these structures, spontaneous polarization results from charge asymmetry in the GaN bonding, while piezoelectric polarization is the product of strain. In quantum well structures, these polarization fields spatially separate the electron and hole wave functions, reducing their radiative recombination efficiency. Due to the strain dependence of piezoelectric polarization, these internal fields grow stronger for with increased-indium-content in the emitting layers required for blue and especially for green lasers and LEDs.

In addition to a reduced radiative recombination coefficient to hinder LED brightness, the internal electric fields induce the quantum confined Stark effect (QCSE) within the light emitting quantum well layers. This effect results in a blue-shift of the peak emission wavelength with increased carrier density in the quantum well layers. Since the carrier density is increased with increased current, a blue or green LED will undergo a shift in peak wavelength as a function of current. Such wavelength dependence on drive current would not be ideal for display applications where the LED is subjected to a current modulation scheme since the color will change with current. In a laser diode the carrier density is increased with increasing current up until the onset of laser threshold where the gain overcomes the loss in the cavity. For achieving lasing wavelengths in the blue and green region, such a blue-shift in the peak wavelength below threshold forces the growth of light emitting layers with increased indium content to compensate the blue-shift. It is well-known that such an increase in indium content can result in degraded material quality due to increased strain and indium-segregation. For the realization of highly efficient blue and green lasers and LEDs, it is therefore desirable to mitigate or completely eliminate polarization-related electric fields.

It has been long understood that growth of device structures on non-conventional GaN orientations, such as the nonpolar a-plane or m-plane or on semipolar planes between nonpolar planes and the polar c-plane, the polarization fields could be eliminated or mitigated. On these novel crystal planes, unique design freedoms became available to both the epitaxial structure and the device structure. Further, the anisotropic strain of InGaN films grown on nonpolar and semipolar substrates results in a reduced effective hole mass, which can increase the differential gain and reduce the transparency current density in laser diodes. Devices such as blue and green lasers and LEDs fabricated on nonpolar and semipolar planes offer exciting potential for improved performance with higher radiative recombination efficiency, reduced peak wavelength blue-shift with drive current, increased device design flexibility, and favorable epitaxial growth quality Typical projectors based on solid-state emitters include:
a light source (laser or LED),
optics,
micro-display such as a liquid crystal on silicon (LCOS) or a digital micro-mirror device (DMD),
driver boards, and
power source (i.e., battery or power adapter).

Depending on the application, projection systems can utilize polarized or unpolarized lights. For example, single scanner based projection systems (e.g., pico projectors) and DLP based systems typically use unpolarized light source. For certain applications, such as LCOS based projection systems, polarized light source is desirable. Usually, blue and green (maybe red) LEDs used in conventional projectors are unpolarized (or demonstrate low polarization ratio), thereby resulting in excessive optical losses from polarization dependent optical components and exhibit a poor spatial mode quality, which require large LCOS or LCD chips, and are not viable for compact designs because the light is not focusable into a small area. Due to the splitting of the X and Y electronic valence bands on nonpolar and semipolar GaN, the light emission from devices such as LEDs fabricated on these platforms is inherently polarized. By employing semipolar and/or nonpolar GaN based LEDs into projection displays using LCOS technologies or other light-valves requiring polarized light, the optical losses associated with the LEDs would be minimized without having to utilize added components such as polarization recyclers which increase the complexity and cost of the system. Conventional projection system often use laser and/or LED as light sources to illuminate images. Typically, laser light source provides better performance than LED light sources in projection systems.

FIG. 1 is a diagram illustrating a conventional projection system. As shown, blue, green, and red laser lights are combined into a laser beam, which is then projected to an MEMS scanning mirror.

In a conventional projection system such as the one illustrated in FIG. 1, a green second-harmonic generation (SHG) laser is used to provide green laser light. Currently there is no direct diode solution for green laser emission, forcing the use of frequency doubled 1060 nm diode lasers which are expensive, bulky, difficult to modulate at high speeds, and emit a narrow spectrum causing speckle in the image. Furthermore, since these devices require generation of a second harmonic using periodically-pulsed lithium niobate (PPLN), there are significant inefficiencies associated with the technology.

First there is the efficiency of the 1060 nm device itself. Second there is the optical coupling losses associated with guiding the light into and out of the PPLN. Third there is the conversion loss within the PPLN. Finally there is the loss associated with cooling the components to a precise temperature.

In order to manufacturer highly efficient display that maximize battery life and minimize cost, size, and weight, optical losses must be minimized from the system. Sources of optical losses in systems include, but are not limited to, losses from optical elements whose transmission is polarization dependent. In many compact projector such as pico projectors, a micro-display technology is used which is highly polarization sensitive, such as LCOS or LCD. A common LCOS based displays typically need highly polarized light sources based on the nature of the liquid crystal display technology.

In various embodiments, the present invention provides blue and green direct diode GaN based lasers that offers offer highly polarized output, single spatial mode, moderate to large spectral width, high efficiency, and high modulation rates ideal for various types of projection and displays, such as pico projectors, DLP projectors, liquid crystal based displays (e.g., liquid crystal on silicon or "LCOS"), and others.

It is to be appreciated that by using highly polarized light source in projection displays as provided by embodiments of the present invention, the optical efficiency can be maximized with minimal costs and maximum flexibility in the selection on optical components. Conventional illumination sources such as unpolarized LEDs and systems thereof, where complicated optics are required for polarization recycling to increase the efficiency from the non-polarized light source. In contrast, by forming blue and green laser and/or LEDs on nonpolar or semipolar GaN the light output will be highly polarized eliminating the need for additional optics to deal with polarization.

As described in the present invention, direct diode lasers having GaN based laser are used for blue and green sources. Conventional c-plane GaN lasers emits unpolarized or near-unpolarized light when laser is below threshold. After the laser reaches threshold the output light will become polarized with increased current. In contrast, lasers fabricated on nonpolar or semipolar GaN according to embodiments of the present invention emit polarized light below threshold and will also have an increased polarization ratio with increased current. By using highly polarized light source in projection displays, the optical efficiency can be maximized with minimal costs and maximum flexibility in the selection on optical components.

In order to manufacturer a highly efficient displays that maximize battery life and minimize cost, size, and weight, optical losses must be minimized from the system. For LCOS systems, convention LCOS is often shrunk to be as small as possible to fit into a tiny volume and also to reduce cost. Therefore, for maximum optical efficiency and minimal power consumption, size, and weight in the display, laser sources are required with high optical spatial brightness.

Conventional LEDs exhibit a poor spatial mode quality, thus requiring large LCOS or LCD chips, and are not viable for compact designs because the light is not focusable into a small area. In contrast, blue and green direct diode GaN based lasers according to the present invention exhibit a single spatial mode for maximum throughput.

Embodiments of the present invention also provides the benefit of reduced speckling. For example, frequency doubled 1060 nm diode lasers used in conventional systems produces a narrow spectrum which causes speckle in the image. Direct diode visible lasers (e.g., green laser) used in embodiments of the present invention offer as much as >100× increase in the spectrum, substantially reducing speckle in the image and reducing the need for additional expensive and bulky components.

Moreover, frequency doubled 1060 nm diode lasers used in conventional system are inefficient because of the second harmonic generation. Direct diode visible lasers used in the present invention offer the potential for substantially higher efficiency with the benefit of reduced optical components and size and weight of the system.

As explained above, a typical miniature projectors (e.g., pico projector) includes the following components:
 a light source (laser or LED),
 optics,
 micro-display such as a LCOS or a DMD display;
 driver boards
 power source, i.e., battery or power adapter Currently, blue and green (maybe red) LEDs are unpolarized leading to excessive optical losses and exhibit a poor spatial mode quality, which require large LCOS or LCD chips, and are not viable for compact designs because the light is not focusable into a small area. Due to the splitting of the X and Y electronic valence bands on nonpolar and semipolar GaN, the light emission from devices such as LEDs fabricated on these platforms is inherently polarized. By employing semipolar and/or nonpolar GaN based LEDs into projection displays or other LCOS technologies, the optical losses associated with unpolarized LEDs would be minimized without having to utilize added components such as polarization recyclers which increase the complexity and cost of the system.

Currently there is no direct diode solution for green laser emission, forcing the use of frequency doubled 1060 nm diode lasers which are expensive, bulky, difficult to modulate at high speeds, and emit a narrow spectrum causing speckle in the image. Furthermore, since these devices require generation of a second harmonic using periodically-pulsed lithium niobate (PPLN), there are significant inefficiencies associated with the technology. First there is the efficiency of the 1060 nm device itself, second there is the optical coupling losses associated with guiding the light into and out of the PPLN, third there is the conversion loss within the PPLN, And finally there is the loss associated with cooling the components to a precise temperature.

The blue and green direct diode GaN based lasers according to embodiments of the present invention offers highly polarized output, single spatial mode, moderate to large spectral width, high efficiency, and high modulation rates ideal for liquid crystal based displays.

Conventional approaches for frequency doubling achieves high spatial brightness, but it does not conveniently enable high modulation frequencies and produces image artifacts when attempted. This limits the modulation frequency of the source to ~100 MHz where amplitude (analog) modulation must be utilized. With increased frequency capability to ~300 MHz, pulsed (digital) modulation could be used which would simplify the system and eliminate the need for look-up tables.

With a direct diode solution afford by embodiments of the present invention, modulation frequencies beyond 300 MHz can be achieved and digital operation can be realized. Nonpolar and/or semipolar based GaN lasers hold great promise for enabling the direct diode green solution, and therefore, digital scanning micro mirror projectors.

Figure 2:
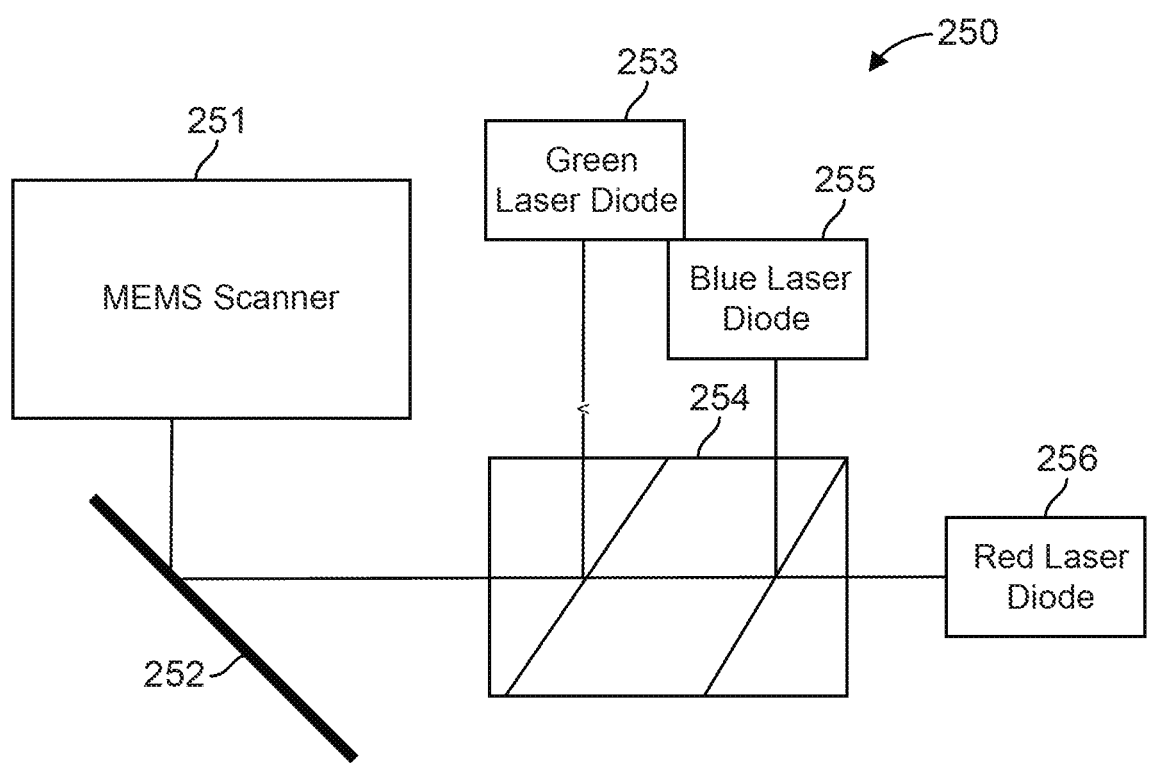
FIG. 2 is a simplified diagram illustrating a projection device according to an embodiment of the present invention.

FIG. 2 is a simplified diagram illustrating a projection device according to an embodiment of the present invention. This diagram is merely an example, which should not unduly limit the scope of the claims. One of ordinary skill in the art would recognize many variations, alternatives, and modifications. A projection system 250 includes a MEMS scanning mirror 251, a mirror 252, an optical member 254, green laser diode 253, red laser diode 256, and blue laser diode 255.

As an example, the projection system 250 is a pico projector. In addition to the components illustrated in FIG. 2, the projection system 250 also includes a housing having an aperture and an input interface for receiving one or more frames of images. The projection system 250 also includes a video processing module. In one embodiment, the video processing module is electrically coupled to an ASIC for driving the laser diodes and the MEMS scanning mirror-scanning mirror 251.

In one embodiment, the laser diodes together with the optical member 254 form a laser source. The green laser diode 253 is characterized by a wavelength of about 490 nm to 540 nm. The laser source is configured produce a laser beam by combining outputs from the blue, green, and red laser diodes. Depending on the application, various types of optical components may be used to combine the light outputs from the laser diodes. For example, optical components can be dichroic lenses, prisms, converging lenses, etc. In a specific embodiment, the combined laser beam is polarized.

In one embodiment, a laser driver module is provided. Among other things, the laser driver module is adapted to adjust the amount of power to be provided to the laser diodes. For example, the laser driver module generates three drive currents based one or more pixels from the one or more frames of images, each of the three drive currents being adapted to drive a laser diode. In a specific embodiment, the laser driver module is configured to generate pulse-modulated signal at a frequency range of about 50 to 300 MHz.

The MEMS scanning mirror 251 is configured to project the laser beam to a specific location through the aperture. For example, the MEMS scanning mirror 251 process one pixel at a specific time onto a specific location corresponding to an pixel of an image. At a high frequency, pixels projected by the MEMS scanning mirror 251 form images.

The MEMS scanning mirror 251 receives light from the laser source though mirror 252. As shown, the mirror 252 is provided within proximity of the laser source. Among other things, the optical member is adapted to direct the laser beam to the MEMS scanning mirror 251.

It is to be appreciated the projection system 250 include other components as well, such as a power source electrically coupled to the laser source and the MEMS scanning mirror 251. Other components can include buffer memory, communication interface, network interface, etc.

As described above, a key component of the projection system 250 is the laser light source. In contrast to conventional projection systems, embodiments of the present invention use highly efficient laser diodes. In a specific embodiment, the blue laser diode operates in a single lateral mode. For example, the blue laser diode is characterized by a spectral width of about 0.5 nm to 2 nm. In a specific embodiment, the blue laser diode is designed for integration into portable applications such as embedded and companion pico projectors and features 60 mW of 445 nm single mode output power in a compact TO-38 package. For example, the blue lasers operate with high efficiency and require minimal power consumption over a broad temperature range, meeting the demanding requirements of consumer projection displays, defense pointers and illuminators, biomedical instrumentation and therapeutics, and industrial imaging applications. According to various embodiments, blue lasers are based on the Indium Gallium Nitride (InGaN) semiconductor technology and are fabricated on GaN substrates.

In various embodiments, the blue and green laser diodes are fabricated using GaN material. The blue laser diode may be semi-polar or non-polar. Similarly, the green laser diode can be semi-polar or non-polar. For example, the red laser diode can be fabricated using GaAlInP material. For example, following combinations of laser diodes are provided, but there could be others:
- Blue polar+Green nonpolar+Red*AlInGaP
- Blue polar+Green semipolar+Red*AlInGaP
- Blue polar+Green polar+Red*AlInGaP
- Blue semipolar+Green nonpolar+Red*AlInGaP
- Blue semipolar+Green semipolar+Red*AlInGaP
- Blue semipolar+Green polar+Red*AlInGaP
- Blue nonpolar+Green nonpolar+Red*AlInGaP
- Blue nonpolar+Green semipolar+Red*AlInGaP
- Blue nonpolar+Green polar+Red*AlInGaP As an example, blue and green laser diodes can be manufactured on m-plane. In a specific embodiment, a blue or green laser diode includes a gallium nitride substrate member having the off-cut m-plane crystalline surface region. In a specific embodiment this offcut angle is between −2.0 and −0.5 degrees toward the c-plane. In a specific embodiment, the gallium nitride substrate member is a bulk GaN substrate characterized by having a semipolar or nonpolar crystalline surface region, but can be others. In a specific embodiment, the bulk nitride GaN substrate comprises nitrogen and has a surface dislocation density below $10^5$ cm$^{-2}$. The nitride crystal or wafer may comprise $Al_xIn_yGa_{1-x-y}N$, where $0 \leq x$, y, $x+y \leq 1$. In one specific embodiment, the nitride crystal comprises GaN, but can be others. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$. In a specific embodiment, the device can be fabricated on a slightly off-cut semipolar substrate as described in U.S. patent application Ser. No. 12/749,466, file Mar. 29, 2010, which is commonly assigned and incorporated by reference herein.

In a specific embodiment where the laser is fabricated on the {20-21} semipolar GaN surface orientation, the device has a laser stripe region formed overlying a portion of the off-cut crystalline orientation surface region. In a specific embodiment, the laser stripe region is characterized by a cavity orientation substantially in a projection of a c-direction, which is substantially normal to the a-direction. In a specific embodiment, the laser strip region has a first end and a second end. In a preferred embodiment, the laser cavity is oriented formed in a projection of the c-direction on a {20-21} gallium and nitrogen containing substrate having a pair of cleaved mirror structures, at the end of cavity. Of course, there can be other variations, modifications, and alternatives.

In a specific embodiment where the laser is fabricated on the nonpolar m-plane GaN surface orientation, the device has a laser stripe region formed overlying a portion of the off-cut crystalline orientation surface region. In a specific embodiment, the laser stripe region is characterized by a cavity orientation substantially in the c-direction, which is substantially normal to the a-direction. In a specific embodiment, the laser strip region has a first end and a second end. In a preferred embodiment, the laser cavity is oriented formed in the c-direction on an m-plane gallium and nitrogen containing substrate having a pair of cleaved mirror structures, at the end of cavity. Of course, there can be other variations, modifications, and alternatives.

In a preferred embodiment, the device has a first cleaved facet provided on the first end of the laser stripe region and a second cleaved facet provided on the second end of the laser stripe region. In one or more embodiments, the first cleaved is substantially parallel with the second cleaved facet. Mirror surfaces are formed on each of the cleaved surfaces. The first cleaved facet comprises a first mirror surface. In a preferred embodiment, the first mirror surface is provided by a top-side skip-scribe scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, including combinations, and the like. Depending upon the embodiment, the first mirror surface can also comprise an anti-reflective coating. Of course, there can be other variations, modifications, and alternatives.

Also in a preferred embodiment, the second cleaved facet comprises a second mirror surface. The second mirror surface is provided by a top side skip-scribe scribing and breaking process according to a specific embodiment. Preferably, the scribing is diamond scribed or laser scribed or the like. In a specific embodiment, the second mirror surface comprises a reflective coating, such as silicon dioxide, hafnia, and titania, tantalum pentoxide, zirconia, combinations, and the like. In a specific embodiment, the second mirror surface comprises an anti-reflective coating. Of course, there can be other variations, modifications, and alternatives.

In a specific embodiment, the laser stripe has a length and width. The length ranges from about 50 microns to about 3000 microns. The strip also has a width ranging from about 0.5 microns to about 50 microns, but can be other dimensions. In a specific embodiment, the width is substantially constant in dimension, although there may be slight variations. The width and length are often formed using a masking and etching process, which are commonly used in the art.

In a specific embodiment, the present invention provides an alternative device structure capable of emitting 501 nm and greater light in a ridge laser embodiment. The device is provided with one or more of the following epitaxially grown elements, but is not limiting:
- an n-GaN cladding layer with a thickness from 100 nm to 5000 nm with Si doping level of 5E17 to 3E18 cm−3
- an n-side SCH layer comprised of InGaN with molar fraction of indium of between 3% and 10% and thickness from 20 to 100 nm
- multiple quantum well active region layers comprised of at least two 2.0-8.5 nm InGaN quantum wells separated by thin 2.5 nm and greater, and optionally up to about 8 nm, GaN barriers
- a p-side SCH layer comprised of InGaN with molar a fraction of indium of between 1% and 10% and a thickness from 15 nm to 100 nm
- an electron blocking layer comprised of AlGaN with molar fraction of aluminum of between 12% and 22% and thickness from 5 nm to 20 nm and doped with Mg.
- a p-GaN cladding layer with a thickness from 400 nm to 1000 nm with Mg doping level of 2E17 cm−3 to 2E19 cm−3
- a p++-GaN contact layer with a thickness from 20 nm to 40 nm with Mg doping level of 1E19 cm−3 to 1E21 cm−3

In a specific embodiment, the laser device is fabricated on a {20-21} semipolar Ga-containing substrate. But it is to be understood that the laser device can be fabricated on other types of substrates such as nonpolar oriented Ga-containing substrate as well.

While light source based on red, green, and blue color sources are widely used, other combinations are possible as well. According to an embodiment of the present invention, the light source used in a projection system combines a yellow light source with the red, green, and blue light sources. For example, the addition of yellow light sources improves the color characteristics (e.g., allowing for wider color gamut) of RBG based projection and display systems. In a specific embodiment, an RGYB light sources is used for a projection system. The yellow light source can be a yellow laser diode manufactured from gallium nitride material or AlInGaP material. In various embodiments, the yellow light source can have a polar, non-polar, or semi-polar orientation. It is to be appreciated that projection systems according to the present invention may use light sources in other colors as well. For example, other colors include cyan, magenta, and others. In a specific embodiment, the laser diodes of the different colors are separately packaged. In another specific embodiment, the laser diodes of two or more of the different colors are copackaged. In yet another specific embodiment, the laser diodes of two or more of the different colors are fabricated on the same substrate.

Figure 2A:
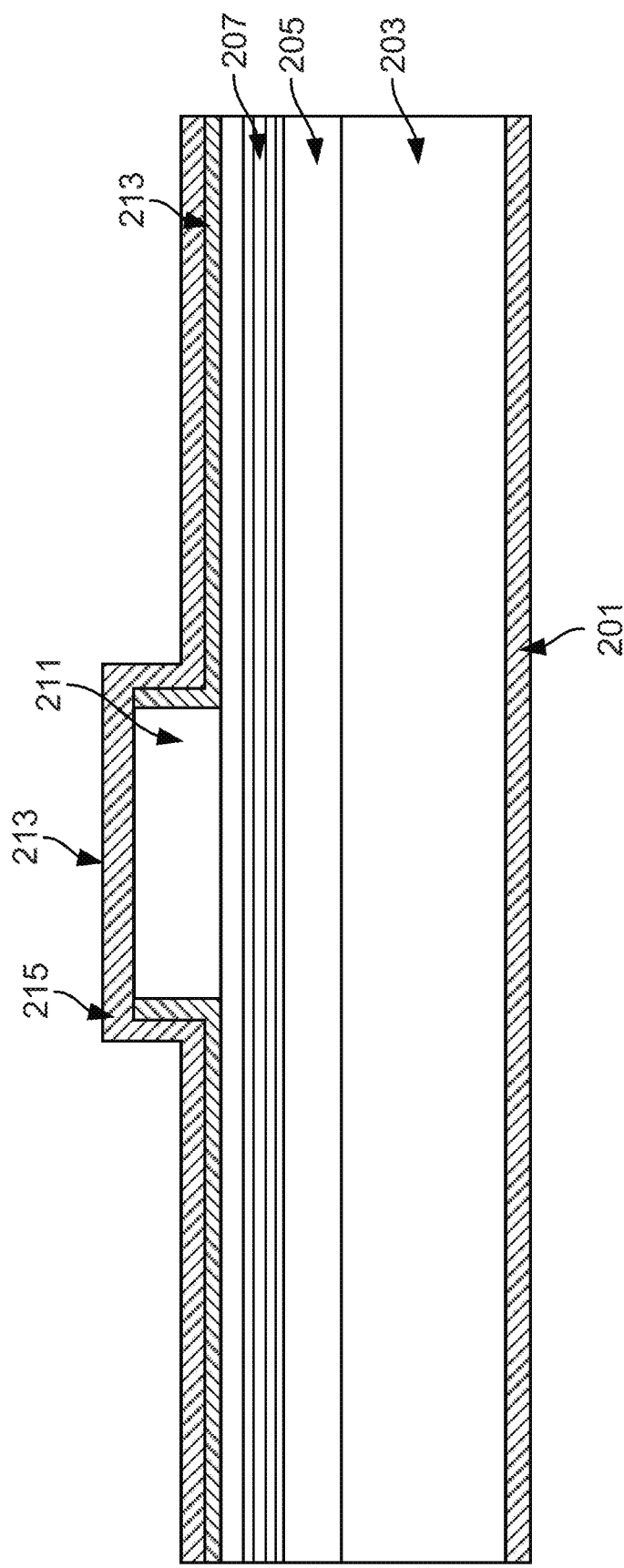
FIG. 2A is a detailed cross-sectional view of a laser device 200 fabricated on a {20-21} substrate according to an embodiment of the present invention.

FIG. 2A is a detailed cross-sectional view of a laser device 200 fabricated on a {20-21} substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In a specific embodiment, the metal back contact region is made of a suitable material such as those noted below and others. Further details of the contact region can be found throughout the present specification and more particularly below.

In a specific embodiment, the device also has an overlying n-type gallium nitride layer 205, an active region 207, and an overlying p-type gallium nitride layer structured as a laser stripe region 209. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where 0≤u, v, u+v≤1, is deposited on the substrate. In a specific embodiment, the carrier concentration may lie in the range between about $10^{16}$ cm$^{-3}$ and $10^{20}$ cm$^{-3}$. The deposition may be performed using MOCVD or MBE. Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 900 and about 1200 degrees Celsius in the presence of a nitrogen-containing gas. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 209. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific embodiment, the dielectric region is an oxide such as silicon dioxide or silicon nitride, but can be others. The contact region is coupled to an overlying metal layer 215. The overlying metal layer is a multilayered structure containing palladium and gold (Pd/Au), platinum and gold (Pt/Au), nickel gold (Ni/Au), but can be others. Of course, there can be other variations, modifications, and alternatives.

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may be comprised of multiple quantum wells, with 2-10 quantum wells. The quantum wells may be comprised of InGaN with GaN barrier layers separating them. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 20 nm. The composition and structure of the active layer are chosen to provide light emission at a preselected wavelength. The active layer may be left undoped (or unintentionally doped) or may be doped n-type or p-type. Of course, there can be other variations, modifications, and alternatives.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where 0≤s, t, s+t≤1, with a higher bandgap than the active layer, and may be doped p-type. In one specific embodiment, the electron blocking layer comprises AlGaN. In another embodiment, the electron blocking layer comprises an AlGaN/GaN superlattice structure, comprising alternating layers of AlGaN and GaN, each with a thickness between about 0.2 nm and about 5 nm. In Of course, there can be other variations, modifications, and alternatives.

As noted, the p-type gallium nitride structure is deposited above the electron blocking layer and active layer(s). The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region. In a specific embodiment, the dielectric region is an oxide such as silicon dioxide, but can be others such as silicon nitride. Of course, there can be other variations, modifications, and alternatives.

Figure 2B:
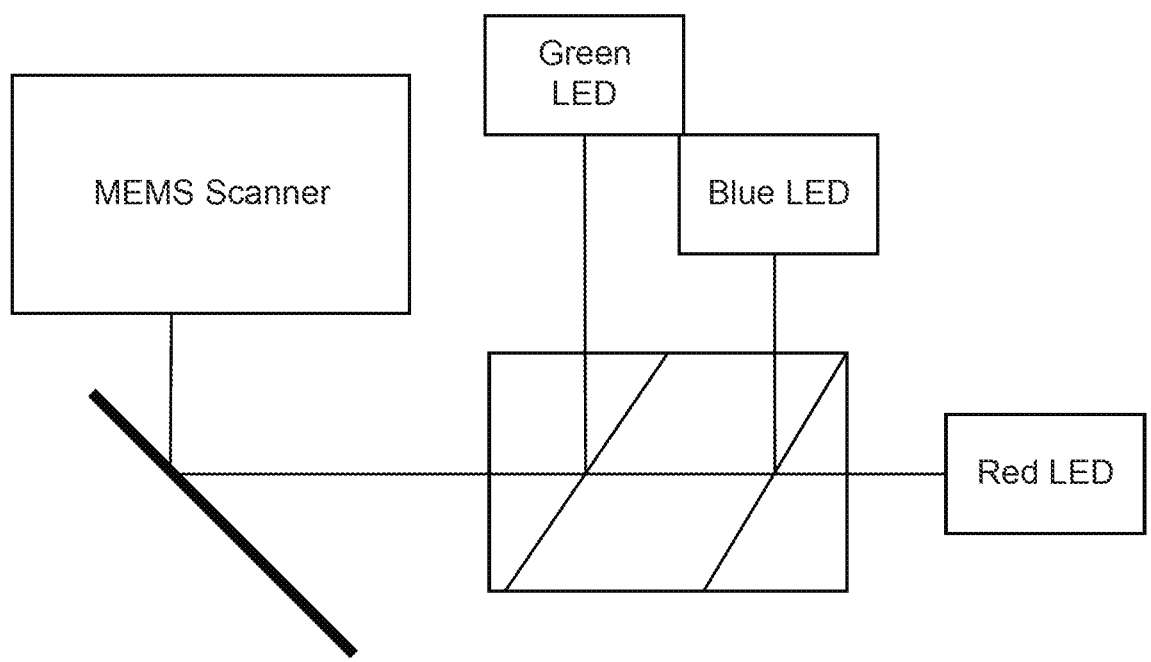
FIG. 2B is a simplified diagram illustrating a projector having LED light sources.

It is to be appreciated the light source of the projector 250 may include one or more LED as well. FIG. 2B is a simplified diagram illustrating a projector having LED light sources. This diagram is merely an example, which should not unduly limit the scope of the claims. One of ordinary skill in the art would recognize many variations, alternatives, and modifications. As an example, the blue and green LEDs are manufactured from gallium nitride containing material. In one specific embodiment, the blue LED is characterized by a non-polar orientation. In another embodiment, the blue LED is characterized by a semi-polar orientation.

Figure 3:
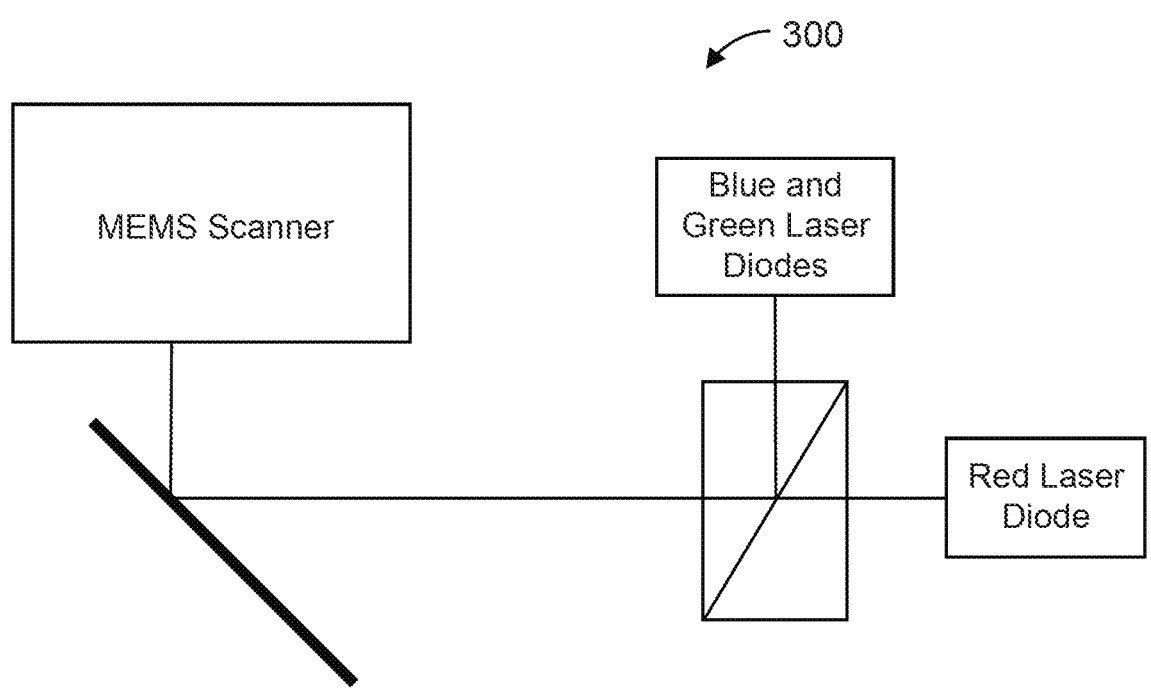
FIG. 3 is an alternative illustration of a projection device according to an embodiment of the present invention.

FIG. 3 is an alternative illustration of a projection device according to an embodiment of the present invention. This diagram is merely an example, which should not unduly limit the scope of the claims. One of ordinary skill in the art would recognize many variations, alternatives, and modifications. In FIG. 3, a projection device includes an MEMS scanning mirror, a mirror, a light conversion member, a red laser diode, a blue diode, and green laser diode. The blue and green laser diodes as shown are integrated as a single package. For example, the blue and green laser shared the same substrate and surface. Output from the blue and green laser diodes are emitted from a common plane of surface. It is to be appreciated that that by having blue and green laser diodes co-packaged, it is possible to substantially reduce the size and cost (e.g., fewer parts) of the projector device.

In addition, the green and blue laser diodes are characterized by a high efficiency. For example, the blue on the green laser diode are manufactured from bulk gallium nitride material. The blue laser diode can be non-polar or semi-polar oriented. The green laser diodes similarly can be non-polar polar or semipolar. For example, following combinations of laser diodes are provided, but there could be others:

Blue polar+Green nonpolar+Red*AlInGaP
Blue polar+Green semipolar+Red*AlInGaP
Blue polar+Green polar+Red*AlInGaP
Blue semipolar+Green nonpolar+Red*AlInGaP
Blue semipolar+Green semipolar+Red*AlInGaP
Blue semipolar+Green polar+Red*AlInGaP
Blue nonpolar+Green nonpolar+Red*AlInGaP
Blue nonpolar+Green semipolar+Red*AlInGaP
Blue nonpolar+Green polar+Red*AlInGaP In one embodiment, the green laser diode is characterized by wavelength of between 480 nm to 540 nm, which is different from conventional production devices that use an infrared laser diode (i.e., emission wavelength of about 1060 nm) and use SHG to double the frequency.

Figure 3A:
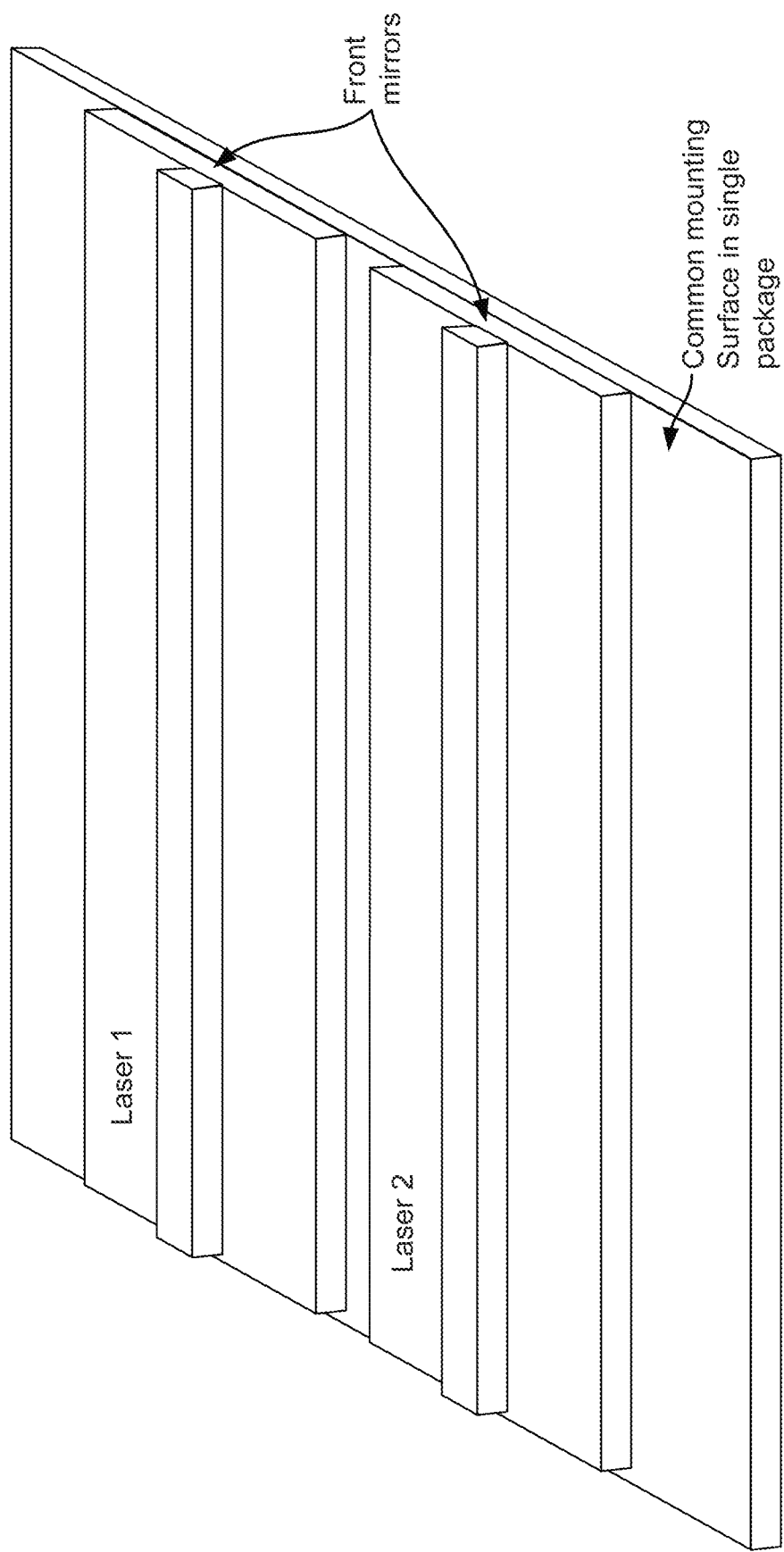
FIG. 3A is a simplified diagram illustrating a laser diodes packaged together according to an embodiment of the present invention.

FIG. 3A is a simplified diagram illustrating a laser diodes packaged together according to an embodiment of the present invention. This diagram is merely an example, which should not unduly limit the scope of the claims. One of ordinary skill in the art would recognize many variations, alternatives, and modifications. As shown in FIG. 3A, two laser diodes are provided on a single package. For example, laser 1 as shown in a blue laser diode and laser 2 is a green laser diode. Optics may be used to combine the outputs of lasers.

The output of the two laser as shown in FIG. 3A can be combined in various ways. For example, optical components such as dichroic lens, waveguide, can be used to combine the outputs of the laser 1 and laser 2 as shown.

Figure 3B:
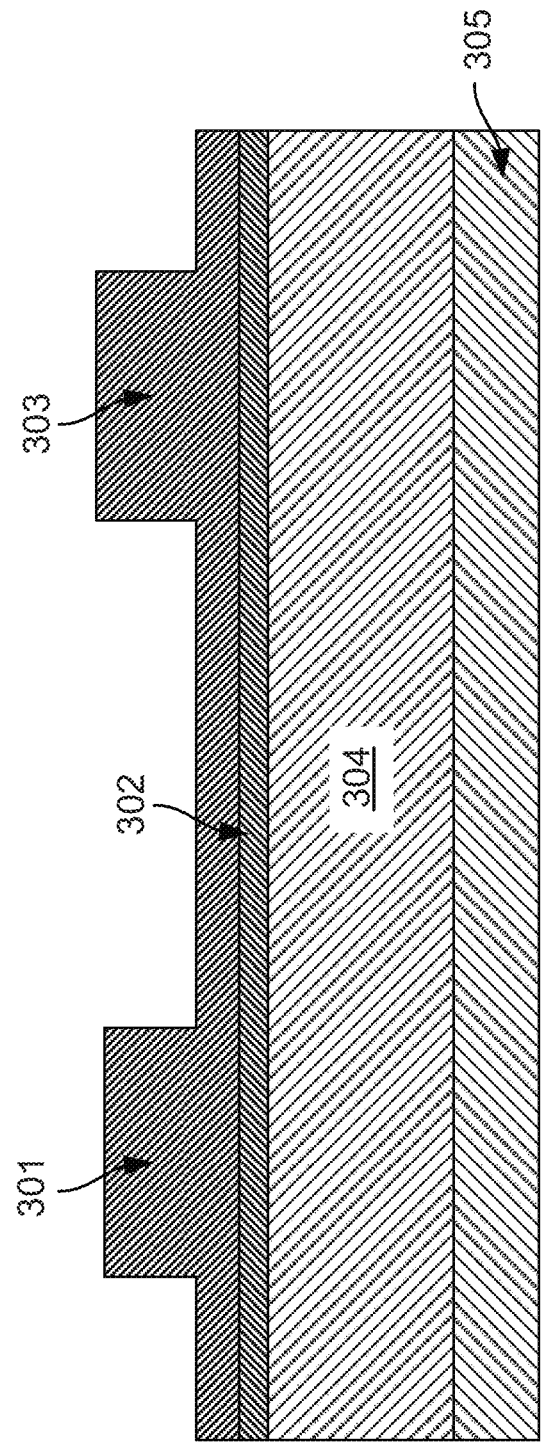
FIG. 3B is a diagram illustrating a cross section of active region with graded emission wavelength according to an embodiment of the present invention.

In other embodiments, blue and green laser diodes are monolithically integrated. FIG. 3B is a diagram illustrating a cross section of active region with graded emission wavelength according to an embodiment of the present invention. This diagram is merely an example, which should not unduly limit the scope of the claims. One of ordinary skill in the art would recognize many variations, alternatives, and modifications. As illustrating FIG. 3B, for example, active regions having different emission gradient are used. Ridged waveguides at different portion of the active region are adapted to emit different wavelength. FIG. 3B shows a cross-section of an active region with graded emission wavelength including ridge waveguide of laser 301 operating at a first peak wavelength determined by the cavity position relative to the emission wavelength of the graded active region 302; ridge waveguide of laser 303 operating at a second peak wavelength determined by the cavity position relative to the emission wavelength of the graded active region 302; active region 302 with a peak emission gradient; n-type cladding region 304; and substrate 305. FIG. 3B shows an example of a graded emission wavelength active region configuration where adjacent lasers are operating at different wavelengths as a result of lasing off being positioned in areas where the active region possesses different peak emission wavelengths.

Figure 3C:
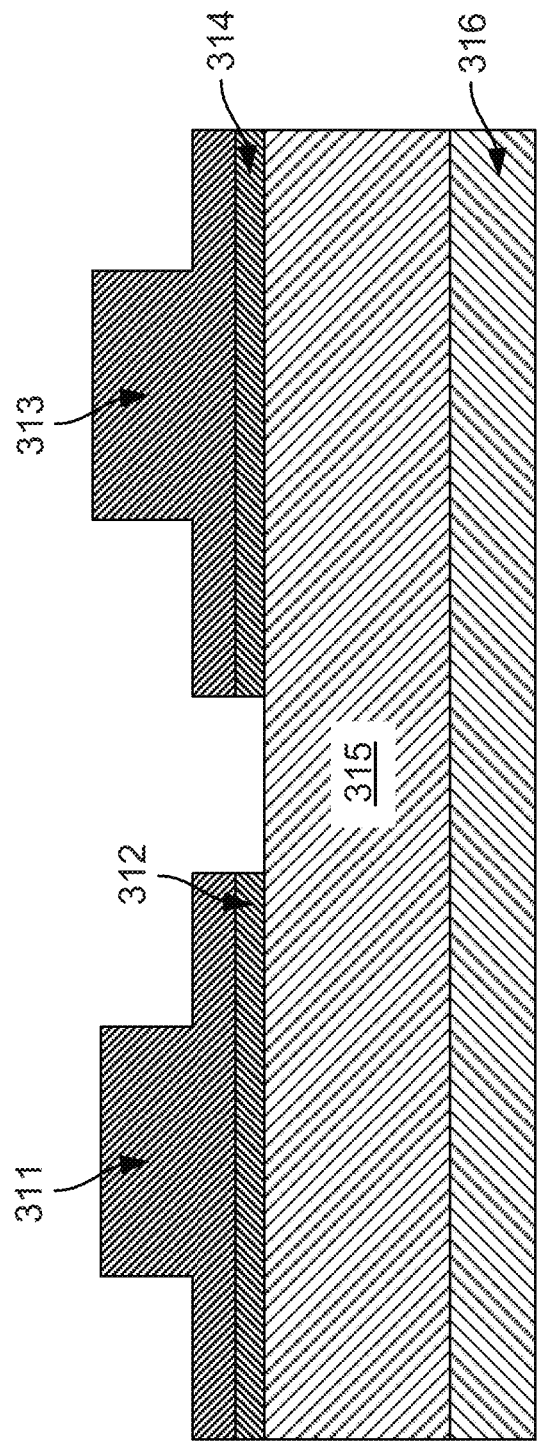
FIG. 3C is a simplified diagram illustrating a cross section of multiple active regions according to an embodiment of the present invention.

FIG. 3C is a simplified diagram illustrating a cross section of multiple active regions according to an embodiment of the present invention. This diagram is merely an example, which should not unduly limit the scope of the claims. One of ordinary skill in the art would recognize many variations, alternatives, and modifications. Among other things, each active region is associated with a specific wavelength. FIG. 3C shows a cross-section of multiple active regions including a ridge waveguide of laser 311 operating at a first peak wavelength from active region 312, which overlies active region 312 with a first peak wavelength; ridge waveguide of laser 313 operating at a second peak wavelength from active region 314, which overlies active region 304 with a second peak wavelength; n-type cladding region 315; and substrate 316. FIG. 3C shows an example of a multiple active region configuration where adjacent lasers are operating at different wavelengths as a result of lasing off of two different active regions with different peak wavelengths.

Figure 3D:
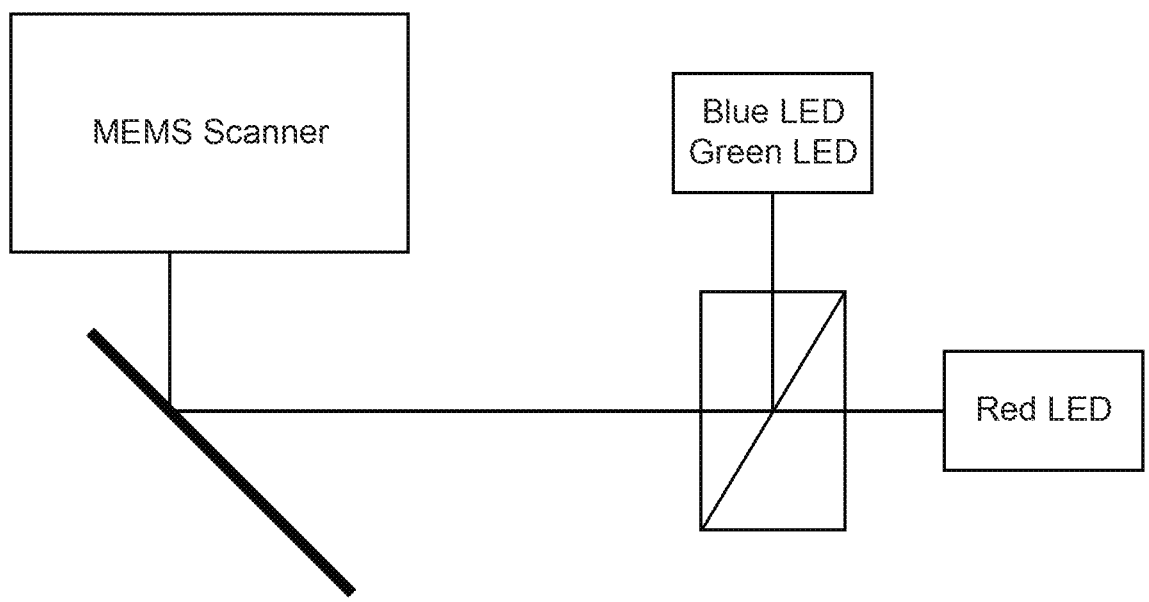
FIG. 3D is a simplified diagram illustrating a projector having LED light sources.

It is to be appreciated the light source of the projector 300 may include one or more LED as well. FIG. 3D is a simplified diagram illustrating a projector having LED light sources. This diagram is merely an example, which should not unduly limit the scope of the claims. One of ordinary skill in the art would recognize many variations, alternatives, and modifications. As an example, the blue and green LEDs are manufactured from gallium nitride containing material. In one specific embodiment, the blue LED is characterized by a non-polar orientation. In another embodiment, the blue LED is characterized by a semi-polar orientation.

Figure 4:
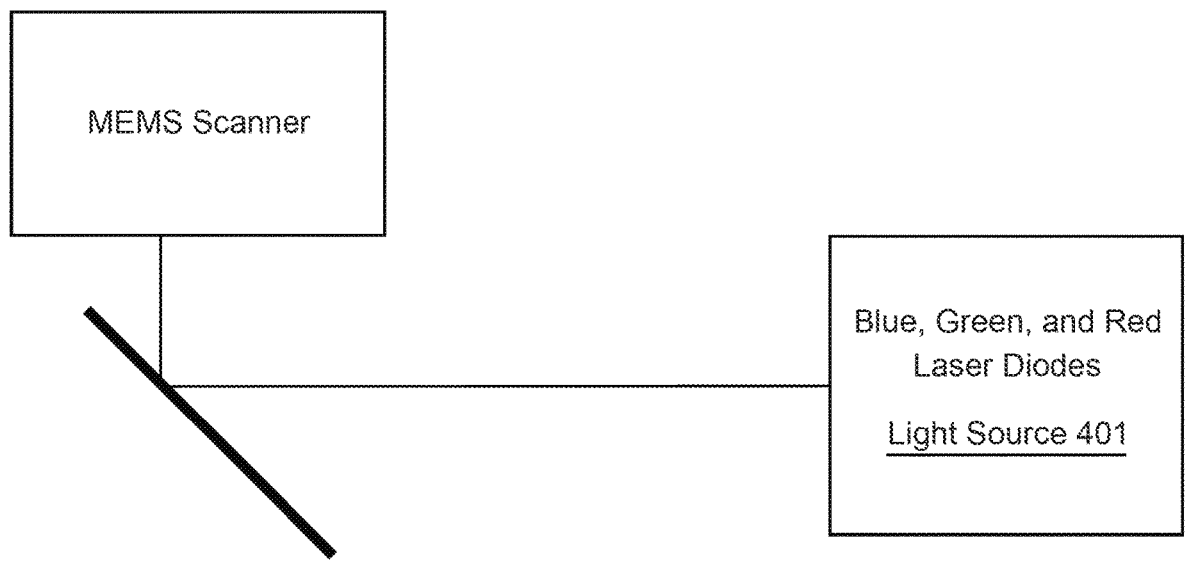
FIG. 4 is a simplified diagram illustrating a projection device according to an embodiment of the present invention.
Figure 4A:
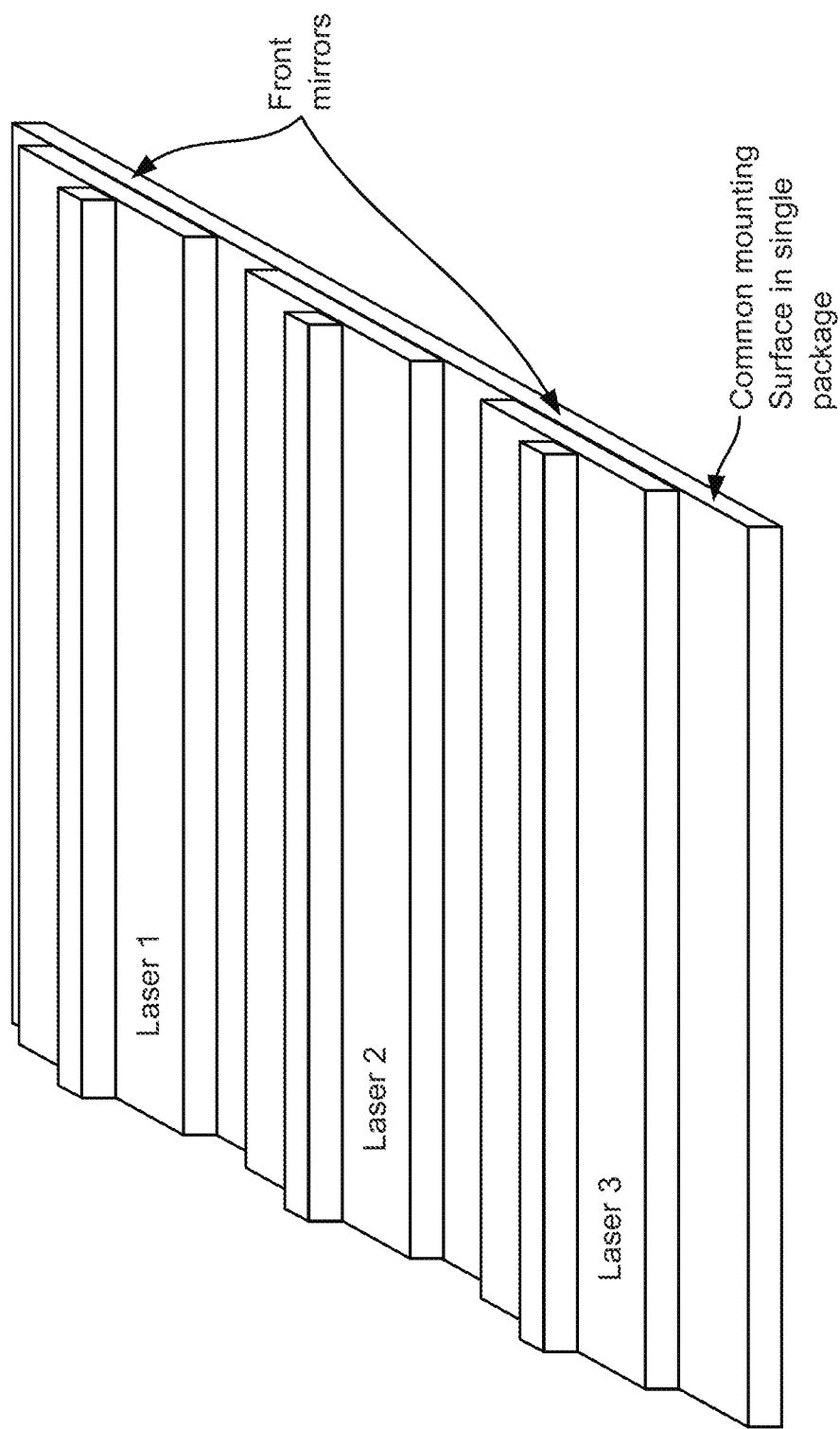
FIG. 4A is a simplified diagram illustrating laser diodes integrated into single package according to an embodiment of the present invention.

FIG. 4 is a simplified diagram illustrating a projection device according to an embodiment of the present invention. This diagram is merely an example, which should not unduly limit the scope of the claims. One of ordinary skill in the art would recognize many variations, alternatives, and modifications. As shown in FIG. 4, blue, green, and red laser diodes are integrated into a light source 401. The light source 401 is combines outputs of each of the laser diodes. The combined light is projected onto the mirror, which reflects the combined light onto the MEMS scanning mirror. It is to be appreciated that, by providing laser diodes in the same package, both the size and cost of the light source 401 can be reduced. For example, following combinations of laser diodes are provided, but there could be others:

Blue polar+Green nonpolar+Red*AlInGaP
    Blue polar+Green semipolar+Red*AlInGaP
    Blue polar+Green polar+Red*AlInGaP
    Blue semipolar+Green nonpolar+Red*AlInGaP
    Blue semipolar+Green semipolar+Red*AlInGaP
    Blue semipolar+Green polar+Red*AlInGaP
    Blue nonpolar+Green nonpolar+Red*AlInGaP
    Blue nonpolar+Green semipolar+Red*AlInGaP
    Blue nonpolar+Green polar+Red*AlInGaP FIG. 4A is a simplified diagram illustrating laser diodes integrated into single package according to an embodiment of the present invention. This diagram is merely an example, which should not unduly limit the scope of the claims. One of ordinary skill in the art would recognize many variations, alternatives, and modifications. For examples, laser 1 can be a green laser diode, laser 2 can be a red laser diode, and laser 3 can be a blue laser diode. Depending on the application, the green laser diode can be fabricated on a semi-polar, non-polar, or polar gallium containing substrates. Similarly, the blue laser diode can be formed on semi-polar, non-polar, or polar gallium containing substrates.

It is to be appreciated that various projection systems according to the present invention have wide range of applications. In various embodiments, the projections systems described above are integrated on cellular telephone, camera, personal computer, portable computer, and other electronic devices.

Figure 5:
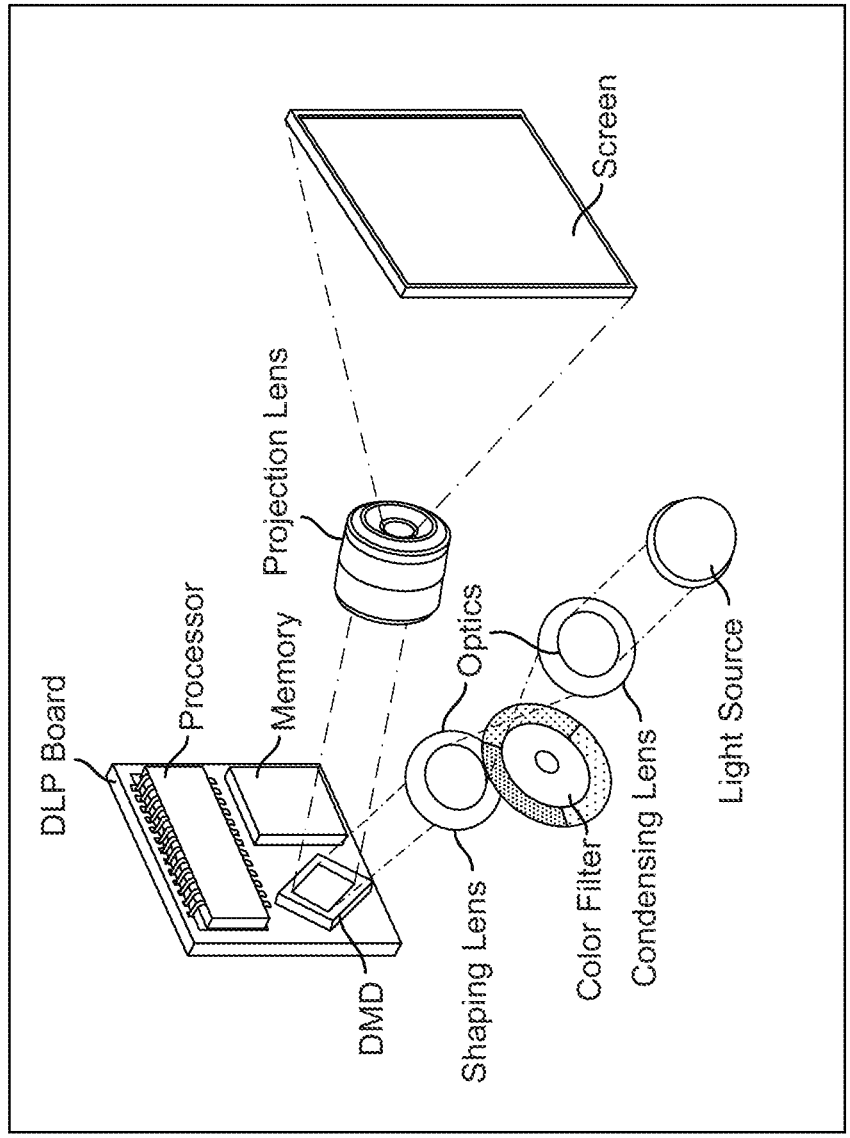
FIG. 5 is a simplified diagram of a DLP projection device according to an embodiment of the present invention.

FIG. 5 is a simplified diagram of a DLP projection device according to an embodiment of the present invention. This diagram is merely an example, which should not unduly limit the scope of the claims. One of ordinary skill in the art would recognize many variations, alternatives, and modifications. As shown in FIG. 5, a projection apparatus includes, among other things, a light source, a condensing lens, a color wheel, a shaping lens, and a digital lighting processor (DLP) board, and a projection lens. The DLP board, among other things, includes a processor, a memory, and a digital micromirror device (DMD).

As an example, the color wheel may include phosphor material that modifies the color of light emitted from the light source. In a specific embodiment, the color wheel includes multiple regions, each of the regions corresponding to a specific color (e.g., red, green, blue, etc.). In an exemplary embodiment, a projector includes a light source that includes blue and red light sources. The color wheel includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the color wheel, or reflected back from it. In either case the green light is collected by optics and redirected to the microdisplay. The blue light passed through the slot is also directed to the microdisplay. The blue light source may be a laser diode and/or LED fabricated on non-polar or semi-polar oriented GaN. In some cases, by combining both blue lasers and blue LEDs, the color characteristics could be improved. Alternate sources for the green light could include green laser diodes and/or green LEDs, which could be fabricated from nonpolar or semipolar Ga-containing substrates. In some embodiments, it could be beneficial to include some combination of LEDs, lasers, and or phosphor converted green light. It is to be appreciated that can be other combinations of colored light sources and color wheels thereof.

As another example, the color wheel may include multiple phosphor materials. For example, the color wheel may include both green and red phosphors in combination with a blue light source. In a specific embodiment, the color wheel includes multiple regions, each of the regions corresponding to a specific color (e.g., red, green, blue, etc.). In an exemplary embodiment, a projector includes a light source that includes a blue light source. The color wheel includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the color wheel, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and color wheels thereof.

As another example, the color wheel may include blue, green, and red phosphor materials. For example, the color wheel may include blue, green and red phosphors in combination with a ultra-violet (UV) light source. In a specific embodiment, color wheel includes multiple regions, each of the regions corresponding to a specific color (e.g., red, green, blue, etc.). In an exemplary embodiment, a projector includes a light source that includes a UV light source. The color wheel includes three phosphor containing regions for converting UV light to blue light, UV light to green light, and UV light and to red light, respectively. In operation, the color wheel emits blue, green, and red light from the phosphor containing regions in sequence. The blue, green and red light from the phosphor may be transmitted through the color wheel, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and color wheels thereof.

Figure 5A:
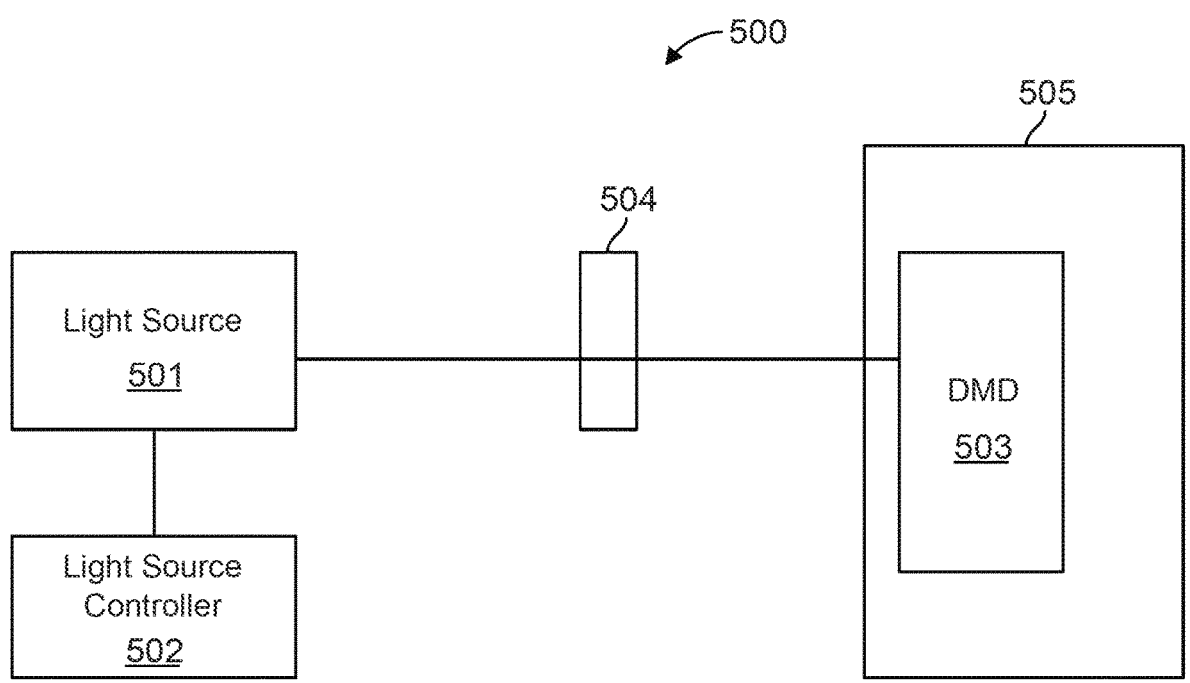
FIG. 5A is a simplified diagram illustrating a DLP projector according to an embodiment of the present invention.

The light source as shown could be made laser-based. In one embodiment, the output from the light source is laser beam characterized by a substantially white color. In one embodiment, the light source combines light output from blue, green, and red laser diodes. For example, the blue, green, and red laser diode can be integrated into a single package as described above. Other combinations are possible as well. For example, blue and green laser diodes share a single package while the red laser diode is packaged by itself. In this embodiment the lasers can be individually modulated so that color is time-sequenced, and thus there is no need for the color wheel. The blue laser diode can be polar, semipolar, and non-polar. Similarly, green laser diode can be polar, semipolar, and non-polar. For example, blue and/or green diodes are manufactured from bulk substrate containing gallium nitride material. For example, following combinations of laser diodes are provided, but there could be others:

Blue polar+Green nonpolar+Red*AlInGaP
    Blue polar+Green semipolar+Red*AlInGaP Blue polar+Green polar+Red*AlInGaP
Blue semipolar+Green nonpolar+Red*AlInGaP
Blue semipolar+Green semipolar+Red*AlInGaP
Blue semipolar+Green polar+Red*AlInGaP
Blue nonpolar+Green nonpolar+Red*AlInGaP
Blue nonpolar+Green semipolar+Red*AlInGaP
Blue nonpolar+Green polar+Red*AlInGaP In FIG. 5, the DLP projection system utilizes a color wheel to project one color (e.g., red, green, or blue) of light at a time to the DMD. The color wheel is needed because the light source continuously provide white light. It is to be appreciated that because solid state devices are used as light source in the embodiments of the present invention, a DLP projector according to the present invention does not require the color wheel shown in FIG. 5. FIG. 5A is a simplified diagram illustrating a DLP projector according to an embodiment of the present invention. This diagram is merely an example, which should not unduly limit the scope of the claims. One of ordinary skill in the art would recognize many variations, alternatives, and modifications.

In an alternative embodiment, the light source comprises a single laser diode. For example, the light source comprises a blue laser diode that outputs blue laser beams. The light source also includes one or more optical members that changes the blue color of the laser beam. For example, the one or more optical members includes phosphor material. The laser beam excites the phosphor material to form a substantially white emission source which becomes the light source for the projection display. In this embodiment, a color wheel is needed in order to sequence the blue, green, and red frames to the DLP.

A projection system 500 includes a light source 501, a light source controller 502, an optical member 504, and a DLP chip 505. The light source 501 is configured to emit a color light to the DMD 503 through the optical member 504. More specifically, the light source 501 includes colored laser diodes. For example, the laser diodes include red laser diode, blue laser diode, and green laser diode. At a predetermined time interval, a single laser diode is turn on while the other laser diodes are off, thereby emitting a single colored laser beam onto the DMD 503. The light source controller 502 provides control signal to the light source 501 to switch laser diodes on and off based on predetermined frequency and sequence. For example, the switching of laser diodes is similar to the function of the color wheel shown in FIG. 5.

Figure 6:
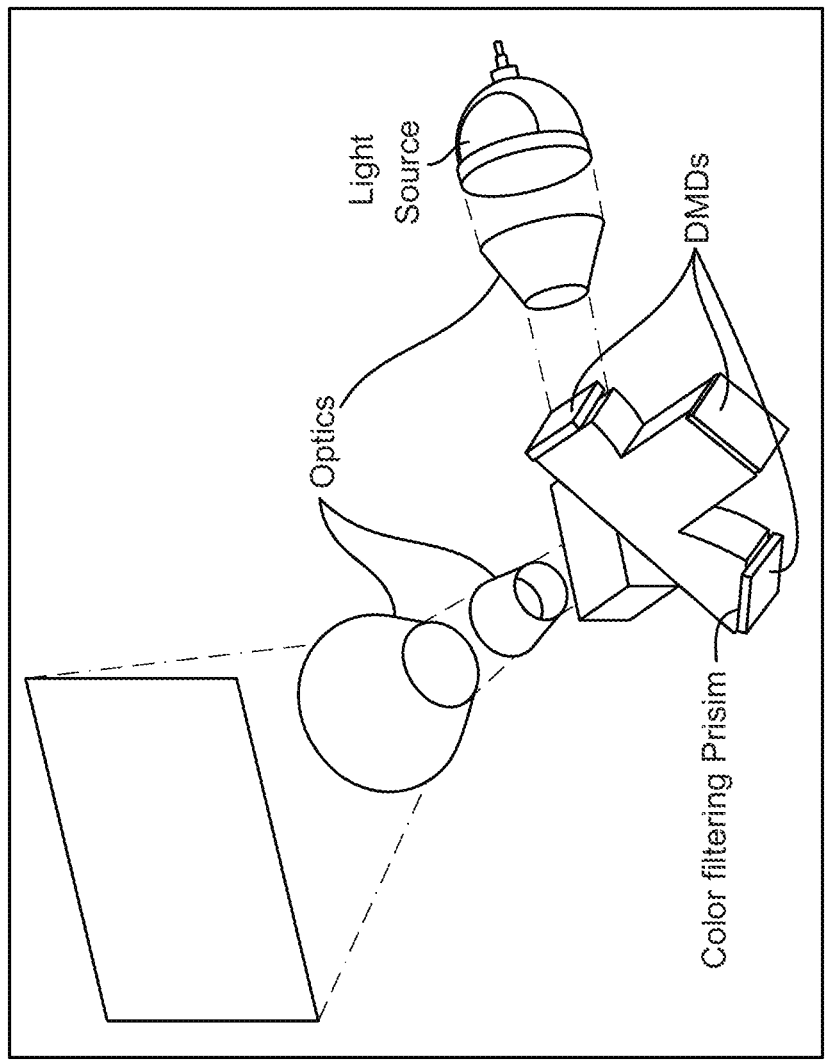
FIG. 6 is simplified diagram illustrating a 3-chip DLP projection system according to an embodiment of the present invention.

FIG. 6 is a simplified diagram illustrating a 3-chip DLP projection system according to an embodiment of the present invention. This diagram is merely an example, which should not unduly limit the scope of the claims. One of ordinary skill in the art would recognize many variations, alternatives, and modifications. As shown in FIG. 5, the 3-chip DLP projection system includes a light source, optics, and multiple DMDs, and a color wheel system. As shown, each of the DMDs is associated with a specific color.

In various embodiment, the white light beam comprises a substantially white laser beam provided by the light source. In one embodiment, the output from the light source is laser beam characterized by a substantially white color. In one embodiment, the light source combines light output from blue, green, and red laser diodes. For example, the blue, green, and red laser diode can be integrated into a single package as described above. Other combinations are possible as well. For example, blue and green laser diodes share a single package while the red laser diode is packaged by itself. The blue laser diode can be polar, semipolar, and non-polar. Similarly, green laser diode can be polar, semipolar, and non-polar. For example, blue and/or green diodes are manufactured from bulk substrate containing gallium nitride material. For example, following combinations of laser diodes are provided, but there could be others:
Blue polar+Green nonpolar+Red*AlInGaP
Blue polar+Green semipolar+Red*AlInGaP
Blue polar+Green polar+Red*AlInGaP
Blue semipolar+Green nonpolar+Red*AlInGaP
Blue semipolar+Green semipolar+Red*AlInGaP
Blue semipolar+Green polar+Red*AlInGaP
Blue nonpolar+Green nonpolar+Red*AlInGaP
Blue nonpolar+Green semipolar+Red*AlInGaP
Blue nonpolar+Green polar+Red*AlInGaP In an alternative embodiment, the light source comprises a single laser diode. For example, the light source comprises a blue laser diode that outputs blue laser beams. The light source also includes one or more optical members that change the blue color of the laser beam. For example, the one or more optical members include phosphor material.

It is to be appreciated that the light source may include laser diodes and/or LEDs. In one embodiment, the light source includes laser diodes in different colors. For example, the light source may additionally include phosphor material for changing the light color emitted from the laser diodes. In another embodiment, the light source includes one or more colored LEDs. In yet another embodiment, light source includes both laser diodes and LEDs. For example, the light source may include phosphor material to change the light color for laser diodes and/or LEDs.

Figure 7:
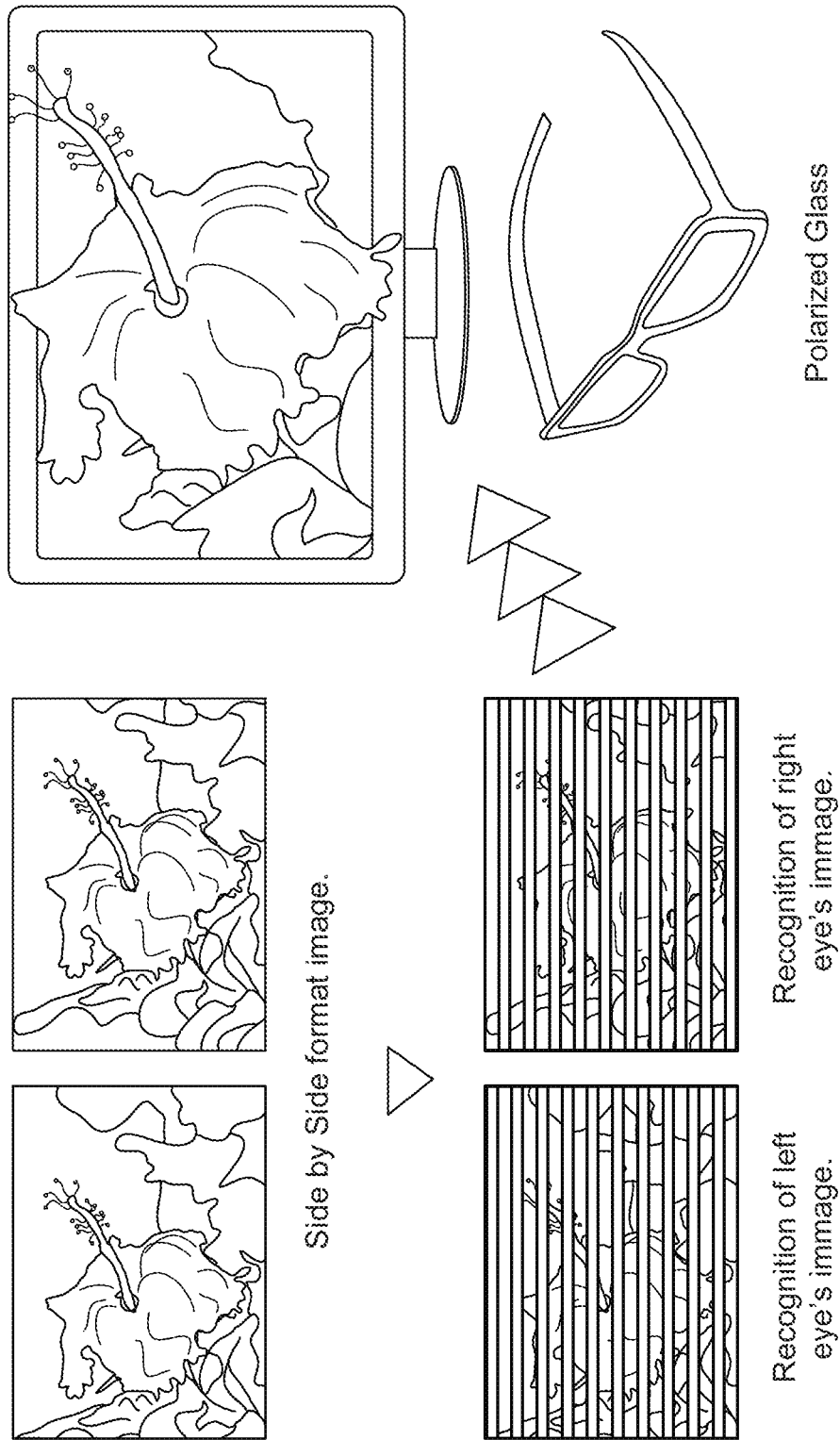
FIG. 7 is a simplified diagram illustrating 3D display involving polarized images filtered by polarized glasses.

In various embodiments, laser diodes are utilized in 3D display applications. Typically, 3D display systems rely on the stereopsis principle, where stereoscopic technology uses a separate device for each person viewing the scene which provides a different image to the person's left and right eyes. Examples of this technology include anaglyph images and polarized glasses. FIG. 7 is a simplified diagram illustrating 3D display involving polarized images filtered by polarized glasses. As shown, the left eye and the right eye perceive different images through the polarizing glasses.

Figure 8:
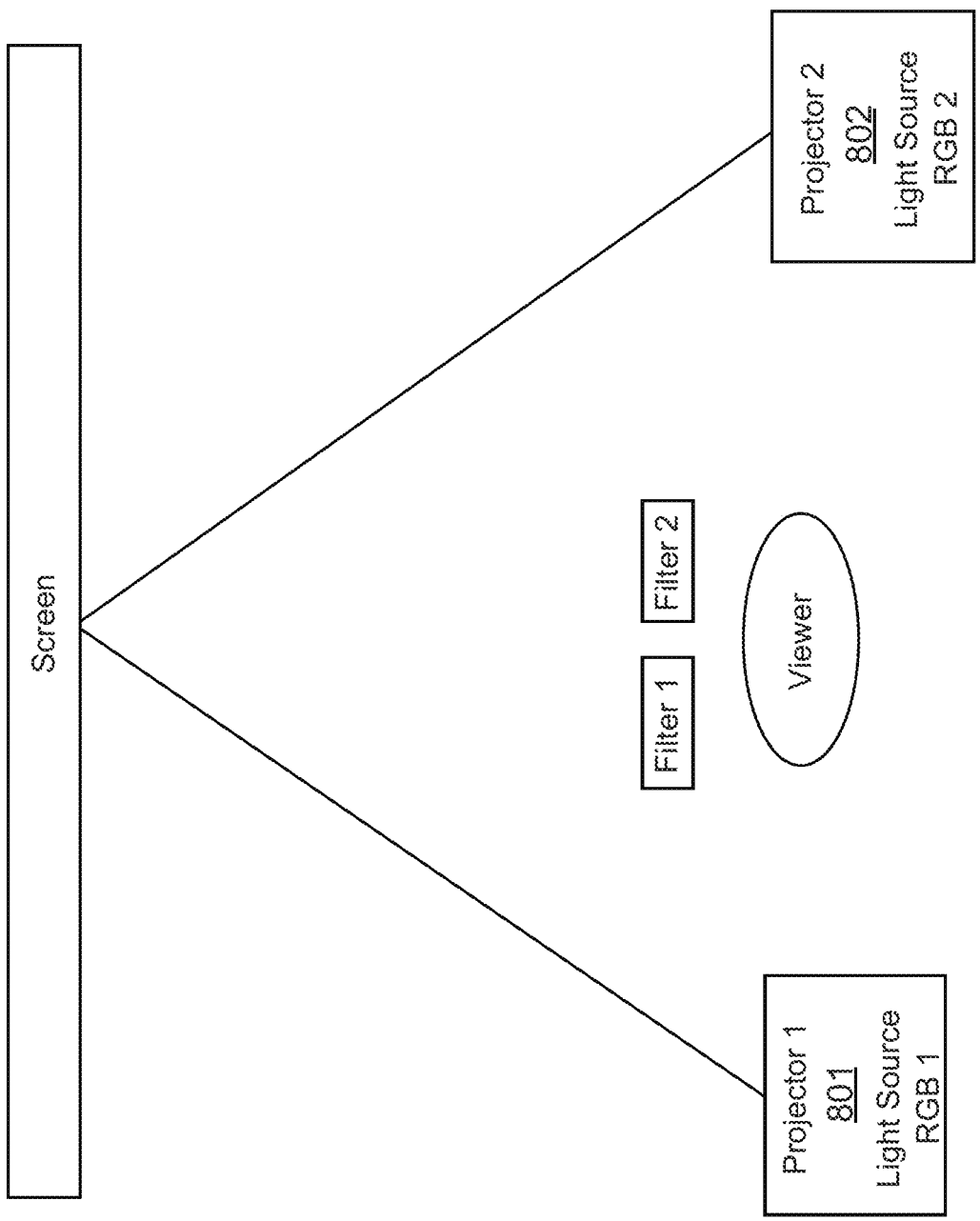
FIG. 8 is a simplified diagram illustrating a 3D projection system according to an embodiment of the present invention.

The conventional polarizing glasses, which typically include circular polarization glasses used by RealD Cinema™, have been widely accepted in many theaters. Another type of image separation is provided by interference filter technology. For example, special interference filters in the glasses and in the projector form the main item of technology and have given it this name. The filters divide the visible color spectrum into six narrow bands—two in the red region, two in the green region, and two in the blue region (called R1, R2, G1, G2, B1 and B2 for the purposes of this description). The R1, G1 and B1 bands are used for one eye image, and R2, G2, B2 for the other eye. The human eye is largely insensitive to such fine spectral differences so this technique is able to generate full-color 3D images with only slight colour differences between the two eyes. Sometimes this technique is described as a "super-anaglyph" because it is an advanced form of spectral-multiplexing which is at the heart of the conventional anaglyph technique. In a specific example, the following set of wavelengths are used:
Left eye: Red 629 nm, Green 532 nm, Blue 446 nm
Right eye: Red 615 nm, Green 518 nm, Blue 432 nm In various embodiments, the present invention provides a projection system for projecting 3D images, wherein laser diodes are used to provide basic RGB colors. FIG. 8 is a simplified diagram illustrating a 3D projection system according to an embodiment of the present invention. This diagram is merely an example, which should not unduly limit the scope of the claims. One of ordinary skill in the art would recognize many variations, alternatives, and modifications. As shown in FIG. 8, a projection system includes a projector 801. The projector 801 is configured to project images associated for one eye (e.g., left eye). The projector 801 includes a first light source. The first light source including a first set of laser diodes: a red laser diode, a green laser diode, and a blue laser diode. Each of the laser diode is associated with a specific wavelength. For example, red laser diode is configured to emit a laser beam characterized by a wavelength of 629 nm, green laser diode is configured to emit a laser beam characterized by a wavelength of 532 nm, and blue laser diode is configured to emit a laser beam characterized by a wavelength of 446 nm. It is to be appreciated that other wavelengths are possible as well.

In various embodiments, the blue laser diode is characterized by a non-polar or semi-polar orientation. For example, the blue laser diode is fabricated from gallium nitride containing substrate. In one specific embodiment, the blue laser diode is manufactured from bulk substrate material. Similarly, the green laser diode can manufactured from gallium nitride containing substrate as well. For example, the green laser diode is characterized by a non-polar or semi-polar orientation.

It is to be appreciated that color LEDs may also be used to provide colored light for the projection elements. For example, a red LED can be used instead of a red laser diode in providing the red light. Similarly LED and/or laser diodes in various colors can be interchangeably used as light sources. Phosphor material may be used to alter light color for light emitted from LED and/or laser diodes.

The projector 802 is configured to project images associated for the other eye (e.g., right eye). The second light source including a second set of laser diodes: a red laser diode, a green laser diode, and a blue laser diode. Each of the laser diode is associated with a specific wavelength, and each of the wavelengths is different from that of the corresponding laser diodes of the first light source. For example, the red laser diode is configured to emit a laser beam characterized by a wavelength of 615 nm, the green laser diode is configured to emit a laser beam characterized by a wavelength of 518 nm, and the blue laser diode is configured to emit a laser beam characterized by a wavelength of 432 nm. It is to be appreciated that other wavelengths are possible as well.

Projectors 801 and 802 shown in FIG. 8 are positioned far apart, but it is to be appreciated that the two projectors may be integrally positioned within one housing unit. In addition to light sources and image source, the projectors include optics for focusing images from the two projectors onto the same screen.

Depending on the specific application, various types of filters can be used to filter projected images for viewers. In one embodiment, bandpass filters are used. For example, a bandpass filter only allows one set of RGB color wavelength to pass to an eye. In another embodiment, notch filters are used, where the notch filters would allow substantially all wavelength except a specific set of RGB color wavelength to pass to an eye. There can be other embodiments as well.

Figure 9:
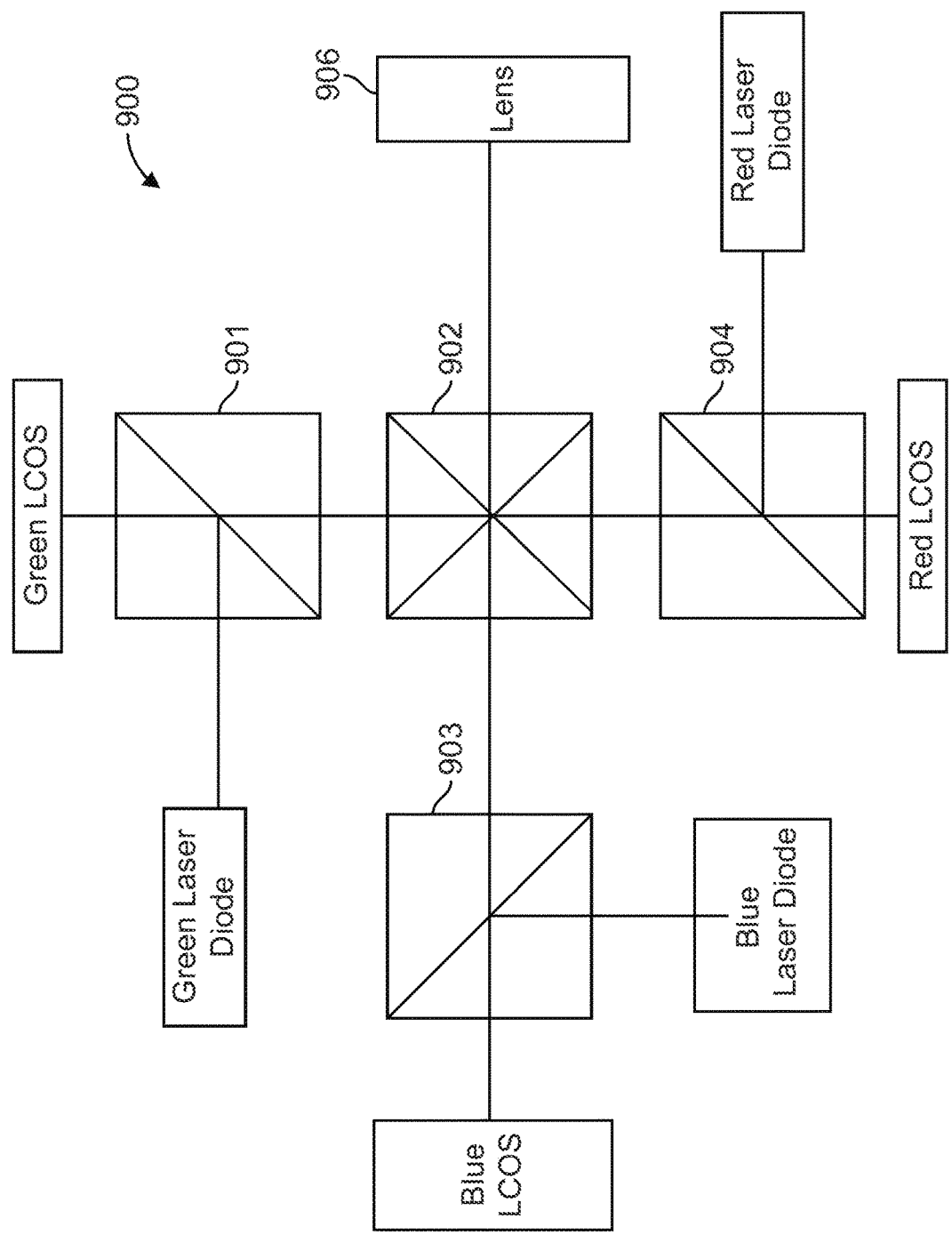
FIG. 9 is a simplified diagram illustrating a LCOS projection system 900 according to an embodiment of the present invention.

In certain embodiments, the present invention provides a liquid crystal on silicon (LCOS) projection system. FIG. 9 is a simplified diagram illustrating a LCOS projection system 900 according to an embodiment of the present invention. This diagram is merely an example, which should not unduly limit the scope of the claims. One of ordinary skill in the art would recognize many variations, alternatives, and modifications. As shown in FIG. 9, a green laser diode provides green laser light to the green LCOS through splitter 901; a blue laser diode provides blue laser light to the blue LCOS through splitter 903; and a red laser diode provides red laser light to the red LCOS through splitter 904. Each of the LCOS is used to form images in a predetermined single color as provided by its corresponding laser diode, and the single-colored image is combined by the x-cube component 902. The combined color image is projected onto the lens 906.

In various embodiments, one or more laser diodes used in the projection system 900 are characterized by semi-polar or non-polar orientation. In one embodiment, the laser diodes are manufactured from bulk substrate. In a specific embodiment, the blue and green laser diodes are manufactured from gallium nitride containing substrate. It is to be appreciated that color LEDs may also be used to provide colored light for the projection elements. For example, a red LED can be used instead of a red laser diode in providing the red light. Similarly LED and/or laser diodes in various colors can be interchangeably used as light sources. Phosphor material may be used to alter light color for light emitted from LED and/or laser diodes.

The LCOS projection system 900 comprises three panels. In an alternative embodiment, the present invention provides a projection system with a single LCOS panel. Red, green, and blue laser diodes are aligned where red, green, and blue laser beams are collimated onto a single LCOS. The laser diodes are pulse-modulated so that only one laser diode is power at a given time and the LCOS is lit by a single color. It is to be appreciated that since colored laser diodes are used, LCOS projection systems according to the present invention do not need beam splitter that split a single white light source into color beams as used in conventional LCOS projection systems. In various embodiments, one or more laser diodes used in the single LCOS projection system are characterized by semi-polar or non-polar orientation. In one embodiment, the laser diodes are manufactured from bulk substrate. In a specific embodiment, the blue and green laser diodes are manufactured from gallium nitride containing substrate. In various embodiments, the configuration illustrated in FIG. 9 is also used in ferroelectric liquid crystal on silicon (FLCOS) systems. For example, the panels illustrated FIG. 9 can be FLCOS panels.

In an example, the housing member provides an enclosure for the components of the laser device. Depending on the specific application, the housing member may be in various types of shapes. Additionally, the housing member can be attached to vehicle mount and/or include tripod. There can be other variations, modifications, and alternatives.

In an example, the present invention provides a light apparatus for a vehicle. The apparatus has a housing to be configured to the vehicle and a laser diode device coupled to the housing, the laser diode device comprising a gallium and nitrogen containing material. In an example, the laser diode device comprises an n-cladding layer with a thickness from 100 nm to 5000 nm with Si doping level of 1E17 to 3E18 cm−3, an n-side SCH layer comprised of InGaN, multiple quantum well active region layers, a p-cladding layer and a p++-GaN contact layer. In an example, the device has a non-polar, semipolar, or polar configuration characterizing the gallium and nitrogen containing material. The apparatus has an optical component coupled to an output laser beam of the laser device and a phosphor material coupled to the laser device to be excited by a laser beam from the laser device. The apparatus has a substantially white light output from the laser device coupled to the phosphor material.

In an example, the invention provides a light source apparatus for a vehicle. The apparatus has a housing to be configured to the vehicle and a laser diode device comprising a gallium and nitrogen containing material coupled to the housing. The apparatus has an output provided on the laser diode device to output a laser beam; and one or more optical members coupled to an output of the optical device and configured to output a substantially white emission by exciting a phosphor material coupled to the one or more optical members.

In an example, the present invention provides a light apparatus. The apparatus comprises a housing to be configured to a vehicle, and a laser diode device coupled to the housing. In an example, the laser diode device comprises a gallium and nitrogen containing material and an optical component coupled to an output laser beam of the laser device. The apparatus has a phosphor material coupled to the laser device to be excited by a laser beam from the laser device and a substantially white light output from the laser device coupled to the phosphor material. The apparatus has a reflector coupled to an output of the laser device, and a controller coupled to the light apparatus. The optical component comprises a waveguide coupled to the laser diode device.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A light apparatus comprising:
   a housing;
   a plurality of edge emitting laser diode devices arranged within the housing, at least one of the plurality of edge emitting laser diode devices comprising:
      a gallium and nitrogen containing material;
      an n-cladding layer with a thickness of greater than about 100 nm and a Si doping level of about 1E17 cm-3 to about 3E18 cm-3;
      an n-side separate confinement heterostructure (SCH) layer comprised of InGaN;
      multiple quantum well active region layers;
      a p-cladding layer; and
      a p++contact layer;
   an optical member configured to receive laser beams output from the plurality of edge emitting laser diode devices, the optical member including a phosphor material arranged to be excited by the laser beams, the optical member configured to provide a substantially white light output; and
   a microelectromechanical system (MEMS) scanning mirror arranged to receive the substantially white light output and project the substantially white light as a spatially dynamic output beam.

2. The apparatus of claim 1 wherein the substantially white light output is provided in a projection system.

3. The apparatus of claim 1 wherein the phosphor material is selected from at least one of a red phosphor, a green phosphor, or a blue phosphor.

4. The apparatus of claim 1 further comprising a reflector coupled to an output of the plurality of edge emitting laser diode devices.

5. The apparatus of claim 1 further comprising a controller coupled to the plurality of edge emitting laser diode devices.

6. The apparatus of claim 1 further comprising a reflector coupled to an output of the plurality of edge emitting laser diode devices and a controller coupled to the plurality of edge emitting laser diode devices.

7. The apparatus of claim 1 wherein the optical member comprises a waveguide coupled to the plurality of edge emitting laser diode devices.

8. The apparatus of claim 1 further comprising a controller coupled to the plurality of edge emitting laser diode devices and a reflector coupled to an output of the plurality of edge emitting laser diode devices, and wherein the optical member comprises a waveguide coupled to the plurality of edge emitting laser diode devices.

9. The apparatus of claim 1 further comprising a controller coupled to the plurality of edge emitting laser diode devices and a reflector coupled to an output of the plurality of edge emitting laser diode devices, and wherein the optical member comprises a waveguide coupled to the plurality of edge emitting laser diode devices, the light apparatus further comprising a projection device configured to receive the substantially white light output.

10. A light source apparatus comprising:
    a housing having an aperture;
    a plurality of edge emitting laser diode devices each comprising a gallium and nitrogen containing material coupled to the housing, the plurality of edge emitting laser diode devices configured to output laser beams, at least one of the plurality of edge emitting laser diode devices comprising:
       an n-cladding layer with a thickness from about 100 nm to about 5000 nm and a Si doping level of about 1E17 cm-3 to about 3E18 cm-3;
       an n-side separate confinement heterostructure (SCH) layer comprised of InGaN;
       multiple quantum well active region layers;
       a p-cladding layer; and
       a p++-GaN contact layer;
    one or more optical members including phosphor material arranged to receive the laser beams output from the plurality of edge emitting laser diode devices and provide a substantially white emission; and
    a microelectromechanical system (MEMS) scanning mirror, the optical member adapted to direct the substantially white light output to the MEMS scanning mirror, and the MEMS scanning mirror arranged to receive the substantially white emission and project the substantially white emission to a specific location through the aperture as a spatially dynamic output beam.

11. The apparatus of claim 10 wherein at least one of the laser beams is characterized by a blue color.

12. The apparatus of claim 10 further comprising a reflector coupled to the one or more optical members.

13. The apparatus of claim 10 further comprising a controller coupled to the plurality of edge emitting laser diode devices.

14. A light apparatus, the apparatus comprising:
    a housing;
    a plurality of edge emitting laser diode devices arranged within the housing, at least one of the plurality of edge emitting laser diode devices comprising a gallium and nitrogen containing material;
    an optical member configured to receive laser beams output from the plurality of edge emitting laser diode devices;
    a phosphor material arranged to be excited by the laser beams to provide a substantially white light output;
    a reflector coupled to an output of the plurality of edge emitting laser diode devices;
    a controller coupled to the plurality of edge emitting laser diode devices; and a microelectromechanical system (MEMS) scanning mirror arranged to receive the substantially white light output and project the substantially white light as a spatially dynamic output beam;

wherein the optical member comprises a waveguide coupled to the plurality of edge emitting laser diode devices.

15. The apparatus of claim 14 wherein at least one of the plurality of edge emitting laser diode devices comprises:

an n-cladding layer with a thickness from about 100 nm to about 5000 nm with Si doping level of about 1E17 cm-3 to about 3E18 cm-3;

an n-side separate confinement heterostructure (SCH) layer comprised of InGaN;

multiple quantum well active region layers;

a p-cladding layer; and a p++-GaN contact layer.

16. The apparatus of claim 14 wherein the gallium and nitrogen containing material includes a non-polar or semi-polar surface configuration.

* * * * *